US012748514B2

(12) United States Patent
Yang et al.

(10) Patent No.: US 12,748,514 B2
(45) Date of Patent: Sep. 29, 2026

(54) TOUCH PANEL, METHOD FOR MANUFACTURING TOUCH PANEL, AND ELECTRONIC DEVICE INCLUDING THE SAME

(71) Applicant: Samsung Display Co., LTD., Yongin-si (KR)

(72) Inventors: Sung-Jin Yang, Yongin-si (KR); Hyunsik Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/984,654

(22) Filed: Dec. 17, 2024

(65) Prior Publication Data

US 2025/0278157 A1 Sep. 4, 2025

(30) Foreign Application Priority Data

Mar. 4, 2024 (KR) ........................ 10-2024-0030595

(51) Int. Cl.
*G06F 3/044* (2006.01)
*H10K 59/40* (2023.01)

(52) U.S. Cl.
CPC .......... *G06F 3/0446* (2019.05); *G06F 3/0443* (2019.05); *G06F 2203/04103* (2013.01); *G06F 2203/04111* (2013.01); *H10K 59/40* (2023.02)

(58) Field of Classification Search
CPC .............................. G06F 3/0446; H10K 59/40
USPC .......................................................... 345/174
See application file for complete search history.

(56) References Cited

U.S. PATENT DOCUMENTS 10,891,008 B2 * 1/2021 Lee ......................... G06F 3/044

FOREIGN PATENT DOCUMENTS

| | | | |
|---|---|---|---|
| CN | 212322238 U | * | 1/2021 |
| KR | 10-2011-0044448 A | | 4/2011 |
| KR | 10-1082293 B1 | | 11/2011 |
| KR | 10-1810892 B1 | | 12/2017 |
| KR | 10-2021-0056483 A | | 5/2021 |
| KR | 10-2023-0043299 A | | 3/2023 |

* cited by examiner

*Primary Examiner* — Duane N Taylor, Jr.
(74) *Attorney, Agent, or Firm* — Womble Bond Dickinson (US) LLP

(57) ABSTRACT

A touch panel includes: a substrate a sensing area and a peripheral area surrounding the sensing area; a first touch insulating layer on the substrate and defining at least one first opening exposing at least a portion of the substate in the sensing area; a first touch electrode array including a plurality of first touch electrodes arranged in a first direction in the sensing area on the first touch insulating layer and a connection portion connecting adjacent first touch electrodes among the first touch electrodes; and a second touch electrode array including a plurality of second touch electrodes arranged in a second direction crossing the first direction in a same layer as the first touch electrodes in the sensing area, and defining a second-first opening between the first touch electrode array and the second touch electrode, the second-first opening overlapping the first opening in a plan view.

14 Claims, 20 Drawing Sheets

TOUCH PANEL, METHOD FOR MANUFACTURING TOUCH PANEL, AND ELECTRONIC DEVICE INCLUDING THE SAME

CROSS-REFERENCE TO RELATED APPLICATION

The present application claims priority to and the benefit of Korean Patent Application No. 10-2024-0030595, filed on Mar. 4, 2024, in the Korean Intellectual Property Office (KIPO), the entire disclosure of which is incorporated herein by reference.

BACKGROUND

1. Field

Aspects of some embodiments relate generally to a touch panel, a method for manufacturing the touch panel, and an electronic device including the same.

2. Description of the Related Art

As information technology develops, the importance of display devices, which provide a communication medium between users and information, is being highlighted. Accordingly, the use of display devices such as liquid crystal display devices, organic light emitting display devices, plasma display devices, and the like is increasing.

A touch panel that recognizes touch input may be used as an input device for display devices, especially smartphones and tablet personal computers (PCs). The touch panel may determine whether or not the user has provided a touch input and calculates the corresponding location as touch input coordinates.

The above information disclosed in this Background section is only for enhancement of understanding of the background and therefore the information discussed in this Background section does not necessarily constitute prior art.

SUMMARY

Aspects of some embodiments include a touch panel with a relatively reduced risk of electrical short circuit.

Aspects of some embodiments include a method for manufacturing the touch panel.

Aspects of some embodiments include an electronic device including the touch panel.

A touch panel according to some embodiments of the present disclosure includes a substrate a sensing area and a peripheral area surrounding at least a portion of the sensing area, a first touch insulating layer on the substrate and defining at least one first opening exposing at least a portion of the substate in the sensing area, a first touch electrode array including a plurality of first touch electrodes arranged in a first direction in the sensing area on the first touch insulating layer and a connection portion connecting adjacent first touch electrodes among the first touch electrodes, and a second touch electrode array including a plurality of second touch electrodes arranged in a second direction crossing the first direction in a same layer as the first touch electrodes in the sensing area, and defining a second-first opening between the first touch electrode array and the second touch electrode, the second-first opening overlapping the first opening in a plan view.

According to some embodiments, a width of the first opening may be greater than a width of the second-first opening.

According to some embodiments, each of the first touch electrode array and the second touch electrode array may cover a side of the first touch insulating layer exposed by the first opening.

According to some embodiments, inside the first opening, metal residual films including a same material as the first and second touch electrode arrays may be located in an outer area of the second-first opening. Inside the first opening, the metal residual films may be not located in a central area of the second-first opening.

According to some embodiments, the touch panel may further include at least one island electrode pattern in the sensing area on the first touch insulating layer and between adjacent second touch electrodes among the second touch electrodes in the plan view, and at least one bridge pattern in the sensing area between the substrate and the first touch insulating layer, entirely covered by the first touch insulating layer, and connecting the island electrode pattern and second touch electrodes adjacent to the island electrode pattern among the second touch electrodes.

According to some embodiments, a width of a portion of the second-first opening overlapping the bridge pattern in the plan view may be greater than a width of a portion of the second-first opening that does not overlap the bridge pattern in the plan view.

According to some embodiments, a second-second opening may be defined between the island electrode pattern and the first touch electrode array.

According to some embodiments, a width of the first opening may be greater than a width of the second-second opening.

According to some embodiments, inside the first opening, metal residual films including a same material as the first and second touch electrode arrays may be located in an outer area of the second-second opening. Inside the first opening, the metal residual films may be not located in a central area of the second-second opening.

According to some embodiments, a width of the first opening may be smaller than a width of the second-first opening and the second-second opening.

According to some embodiments, each of the first and second touch electrode arrays may not overlap the first opening in the plan view.

According to some embodiments, the touch panel may further include a second touch insulating layer on the first touch insulating layer, the first touch electrode array, and the second touch electrode array, and filling the first opening, the second-first opening, and the second-second opening.

In a method for manufacturing the touch panel according to some embodiments of the present disclosure, the method includes forming a first metal layer on a substrate including a sensing area and a peripheral area surrounding at least a portion of the sensing area, forming a metal pattern overlapping the sensing area by removing a portion of the first metal layer, forming a first touch insulating layer covering the metal pattern on the substrate, forming at least one first opening exposing the metal pattern by removing a portion of the first touch insulating layer, forming a first touch electrode array and a second touch electrode array defining a second-first opening between the first touch electrode array and the second touch electrode, the second-first opening overlapping the first opening in a plan view in the sensing area on the first touch insulating layer, and removing the metal pattern.

According to some embodiments, a width of the first opening may be greater than a width of the second-first opening.

According to some embodiments, the forming of the first touch electrode array and the second touch electrode array may include forming a second metal layer on the first touch insulating layer and the metal pattern, and forming metal residual films located on the substrate and the metal pattern, the first touch electrode array, and the second touch electrode array by removing a portion of the second metal layer.

According to some embodiments, in the removing the metal pattern, the metal pattern and the metal residual films located on the metal pattern may be removed simultaneously.

According to some embodiments, the first touch electrode array may include a plurality of first touch electrodes arranged in a first direction and a connection portion connecting adjacent first touch electrodes among the first touch electrodes. The second touch electrode array may include a plurality of second touch electrodes arranged in a second direction crossing the first direction in a same layer as the first touch electrodes.

According to some embodiments, the forming the first touch electrode array and the second touch electrode array may include: forming at least one island electrode pattern in the sensing area on the first touch insulating layer between adjacent second touch electrodes among the second touch electrodes in the plan view. The forming the metal pattern may include: forming at least one bridge pattern entirely covered by the first touch insulating layer, and connecting the island electrode pattern and second touch electrodes adjacent to the island electrode pattern among the second touch electrodes in the sensing area between the substrate and the first touch insulating layer. A second-second opening having a width smaller than a width of the first opening may be defined between the island electrode pattern and the first touch electrode array.

An electronic device according to some embodiments of the present disclosure includes a display device and a processor which controls the display device, the display device includes: a display panel including a display area in which a plurality of pixels are arranged and a non-display area surrounding at least a portion of the display area and a touch panel on the display panel and including: a substrate including a sensing area corresponding to the display area, and a peripheral area surrounding at least a portion of the sensing area and corresponding to the non-display area, a first touch insulating layer on the substrate and defining at least one first opening exposing at least a portion of the substate in the sensing area, a first touch electrode array including a plurality of first touch electrodes arranged in a first direction in the sensing area on the first touch insulating layer and a connection part connecting adjacent first touch electrodes among the first touch electrodes, and a second touch electrode array including a plurality of second touch electrodes arranged in a second direction crossing the first direction in a same layer as the first touch electrodes in the sensing area, and defining a second opening between the first touch electrode array and the second touch electrode, the second opening overlapping the first opening in a plan view.

According to some embodiments, a width of the first opening may be greater than a width of the second opening.

According to some embodiments of the present disclosure, a touch panel may include a first touch insulating layer defined by at least one first opening exposing a portion of the second substrate SUB2 in a sensing area, a first touch electrode array on the first touch insulating layer and including a plurality of first touch electrode arranged in a first direction, and a second touch electrode array on the first touch insulating layer and including a plurality of second touch electrode arranged in a second direction DR2. A second opening overlapping the first opening in a plan view may be defined between the first touch electrode array and the second touch electrode array. Accordingly, the risk of electrical short circuit due to metal residual films may be minimized or reduced.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
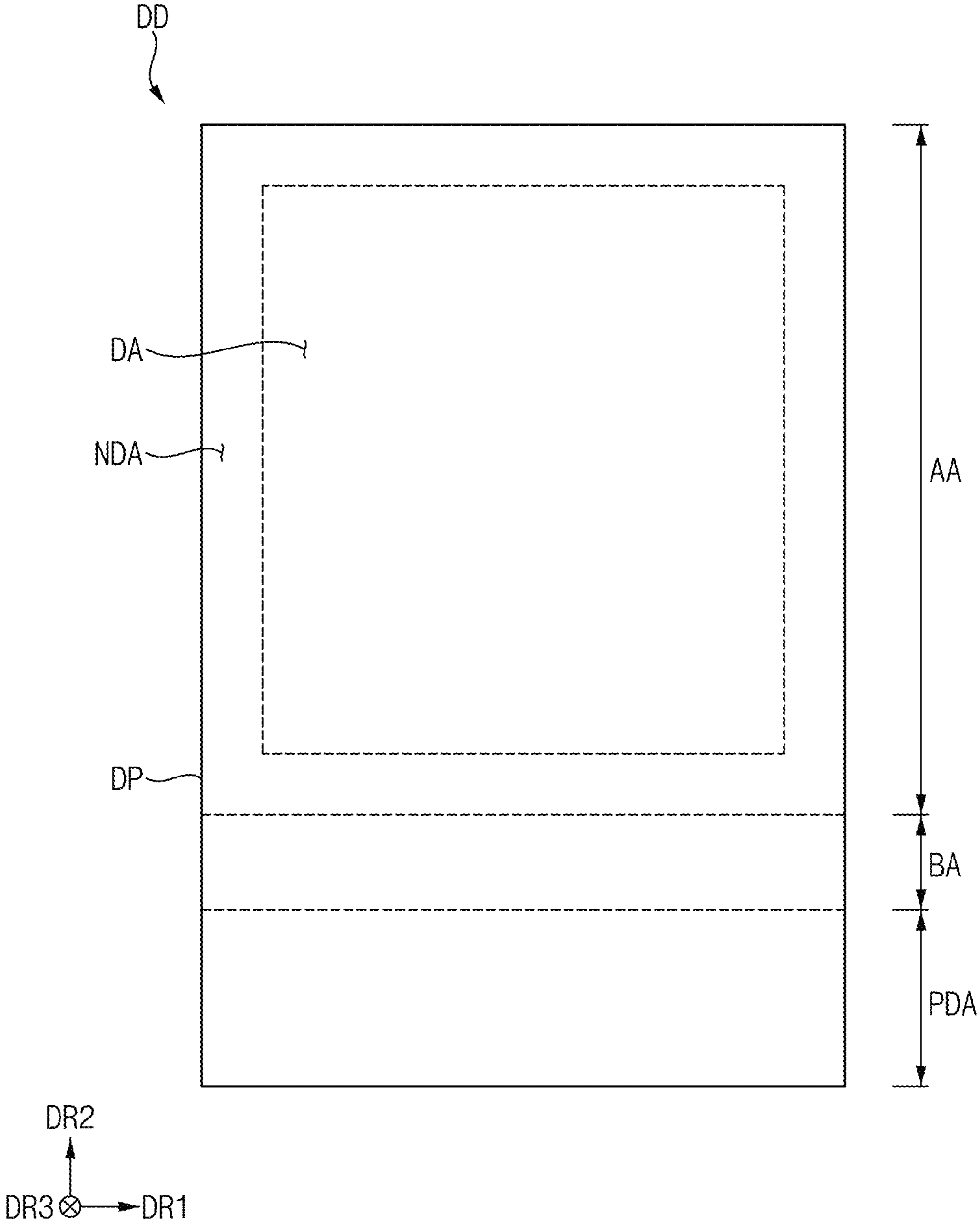
FIG. 1 is a plan view illustrating a display device according to some embodiments of the present disclosure.

Hereinafter, a touch panel, a method for manufacturing the touch panel, and a display device including the touch panel according to some embodiments of the present disclosure will be explained in more detail with reference to the accompanying drawings. The same reference numerals are used for the same components in the drawings, and redundant descriptions of the same components will be omitted.

Figure 2:
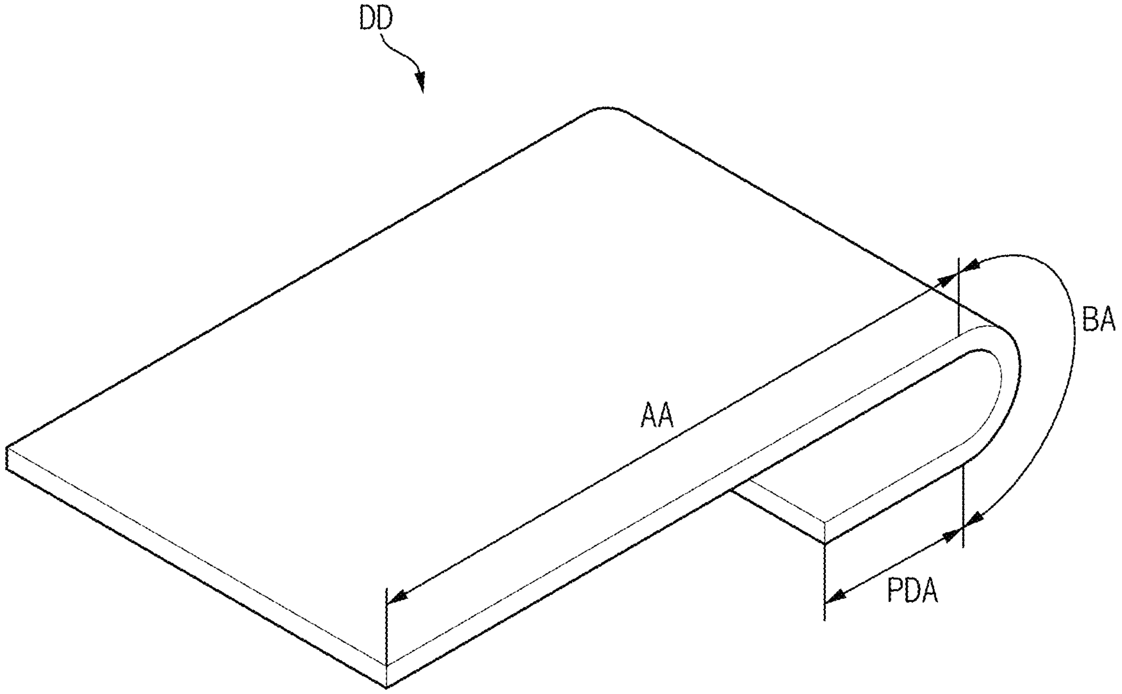
FIG. 2 is a view illustrating a bent shape of the display device of FIG. 1.

FIG. 1 is a plan view illustrating a display device according to some embodiments of the present disclosure. FIG. 2 is a view illustrating a bent shape of the display device of FIG. 1.

Referring to FIGS. 1 and 2, the display device DD according to some embodiments of the present disclosure may include a display panel DP.

The display panel DP may include a display area DA and a non-display area NDA. The display area DA may be an area that can display images by generating light or adjusting the transmittance of light provided from an external light source. The non-display area NDA may be an area that does not display images. The non-display area NDA may be located around (e.g., in a periphery or outside a footprint of) the display area DA. For example, the non-display area NDA may entirely surround the display area DA.

A plurality of pixels may be located in the display area DA. Each of the pixels may emit light. As the pixels emit light, the display area DA may display images.

Lines connected to the pixels may be further located in the display area DA. For example, the lines may include data lines, scan signal lines, power lines, and the like.

A driver for driving the pixels may be located in the non-display area NDA. For example, the driver may include a scan driver, an emission driver, a power supply voltage generator, a timing controller, and the like. The pixels may emit light based on signals received from the drivers.

The non-display area NDA may include a bending area BA and a pad area PDA. The pad area PDA may be located on one side of the display area DA. For example, the pad area PDA may be arranged to be spaced apart from one side of the display area DA in a direction opposite to a second direction DR2 parallel to an upper surface of the display panel DP.

Signal pads through which a display driving circuit is electrically connected to the connection film may be located in the pad area PDA. Further detailed description of this will be provided later with reference to FIG. 4.

The bending area BA may be located between the display area DA and the pad area PDA in a plan view. As illustrated in FIG. 2, the bending area BA may be bent based on a bending axis extending in a first direction DR1. In this case, the pad area PDA may overlap a main area AA, which is defined as the display area DA and a portion of the non-display area NDA, in the plan view. For example, the pad area PDA may be located under the main area AA. The display device DD may be provided or formed in a shape in which the bending area BA is configured to be bent about the bending axis.

In this specification, a plane may be defined as the first direction DR1 and the second direction DR2 crossing the first direction DR1. For example, the first direction DR1 may be perpendicular to the second direction DR2. In addition, a third direction DR3 may be perpendicular to the plane. As used herein, the phrase "in a plan view" may refer to a view from the third direction DR3 toward a display surface of the display device DD.

For example, the display device DD may be any one of an organic light emitting display device (OLED), a liquid crystal display device (LCD), a quantum dot emission display device, a micro light emitting diode display device, a field emission display device (FED), a plasma display device (PDP), and an electrophoretic display device (EPD). Hereinafter, the description focuses on the fact that the display device DD is an organic light emitting display device, but embodiments according to the present disclosure are not necessarily limited thereto.

Figure 3:
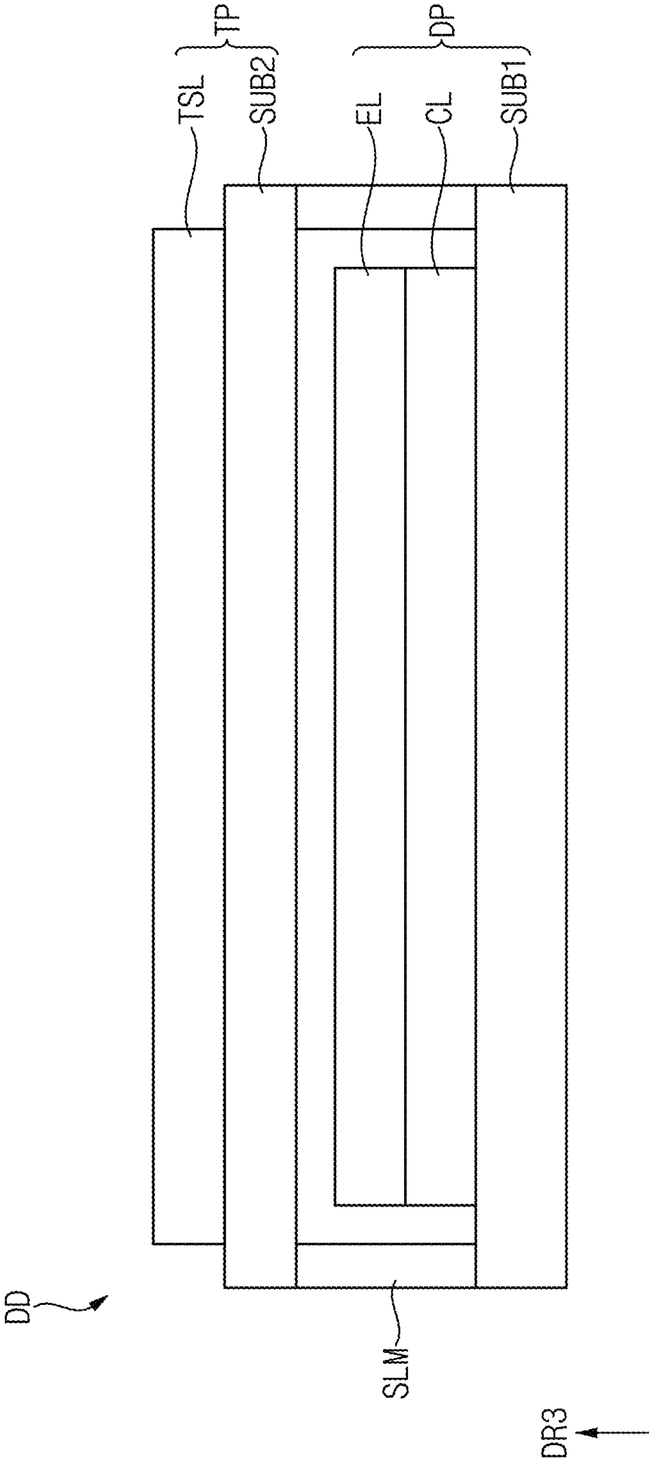
FIG. 3 is a cross-sectional view schematically illustrating the display device of FIG. 1.

FIG. 3 is a cross-sectional view schematically illustrating the display device of FIG. 1.

Referring to FIGS. 1 and 3, the display device DD according to some embodiments of the present disclosure may include the display panel DP, a sealing member SLM, and a touch panel TP.

The display panel DP may include a first substrate SUB1, a circuit layer CL, and a light emitting element layer EL.

The first substrate SUB1 may include a transparent material or an opaque material. For example, the first substrate SUB1 may include an insulating material such as glass, quartz, polymer resin, and the like. Examples of the polymer resin that can be used as the first substrate SUB1 may include polyethersulfone (PES), polyacrylate (PA), polyarylate (PAR), polyetherimide (PEI), polyethylene napthalate (PEN), polyethylene terephthalate (PET), polyimide (PI), polycarbonate (PC), and the like. These can be used alone or in combination with each other. Alternatively, the first substrate SUB1 may include a metal material. However, embodiments according to the present disclosure are not limited thereto.

The circuit layer CL may be located on the first substrate SUB1. For example, the circuit layer CL may include a transistor, a data line, a scan signal line, a power line, a scan control line, and the like. The circuit layer CL may overlap the display area DA and the non-display area NDA. For example, the transistor, the data line, the scan signal line, and the power line of the circuit layer CL may overlap the display area DA, and the scan control line may overlap the non-display area NDA. Further detailed description of the components of the circuit layer CL will be described later.

The light emitting element layer EL may be located on the circuit layer CL. The light emitting element layer EL may include a light emitting element that generates light and a pixel defining layer defining a pixel. The light emitting element of the light emitting element layer EL may overlap the display area DA. Further detailed description of the components of the light emitting element layer EL will be described later.

The touch panel TP may include a second substrate SUB2 and a touch sensing layer TSL.

The second substrate SUB2 may include a transparent material or an opaque material. For example, the second substrate SUB2 may include an insulating material such as glass, quartz, polymer resin, and the like. Examples of the polymer resin that can be used as the second substrate SUB2 may include polyethersulfone, polyacrylate, polyarylate, polyetherimide, polyethylene naphthalate, polyethylene terephthalate, polyimide, polycarbonate, and the like. These can be used alone or in combination with each other. Alternatively, the second substrate SUB2 may include a metal material. However, embodiments according to the present disclosure are not limited thereto. In addition, the second substrate SUB2 may serve as an encapsulation substrate encapsulating the light emitting element layer EL.

The touch sensing layer TSL may be located on the second substrate SUB2. The touch sensing layer TSL may includes a plurality of touch electrode arrays for detecting user processing in a capacitance method, a touch pad part, and a plurality of touch driving lines and a plurality of touch sensing lines electrically connecting the touch pad part and the touch electrode arrays. For example, the touch sensing layer TSL may detect the user's touch using a self-capacitance method or a mutual capacitance method. However, embodiments according to the present disclosure are not limited thereto.

An anti-reflection layer and a cover window may be additionally located on the touch sensing layer TSL. In this case, the anti-reflection layer may be located on the touch sensing layer TSL, and the cover window may be attached to the anti-reflection layer using a transparent adhesive member.

The sealing member SLM may couple the first substrate SUB1 of the display panel DP and the second substrate SUB2 of the touch panel TP in the non-display area NDA. For example, the sealing member SLM may include a frit adhesive layer, an ultraviolet curable resin, or a thermosetting resin. However, embodiments according to the present disclosure are not limited thereto.

Although FIG. 3 illustrates an empty space between the light emitting element layer EL and the second substrate SUB2, embodiments according to the present disclosure are not limited thereto. For example, a filling film may be located between the light emitting element layer EL and the second substrate SUB2. The filling film may include an epoxy filling film or a silicone filling film. However, embodiments according to the present disclosure are not limited thereto.

Figure 4:
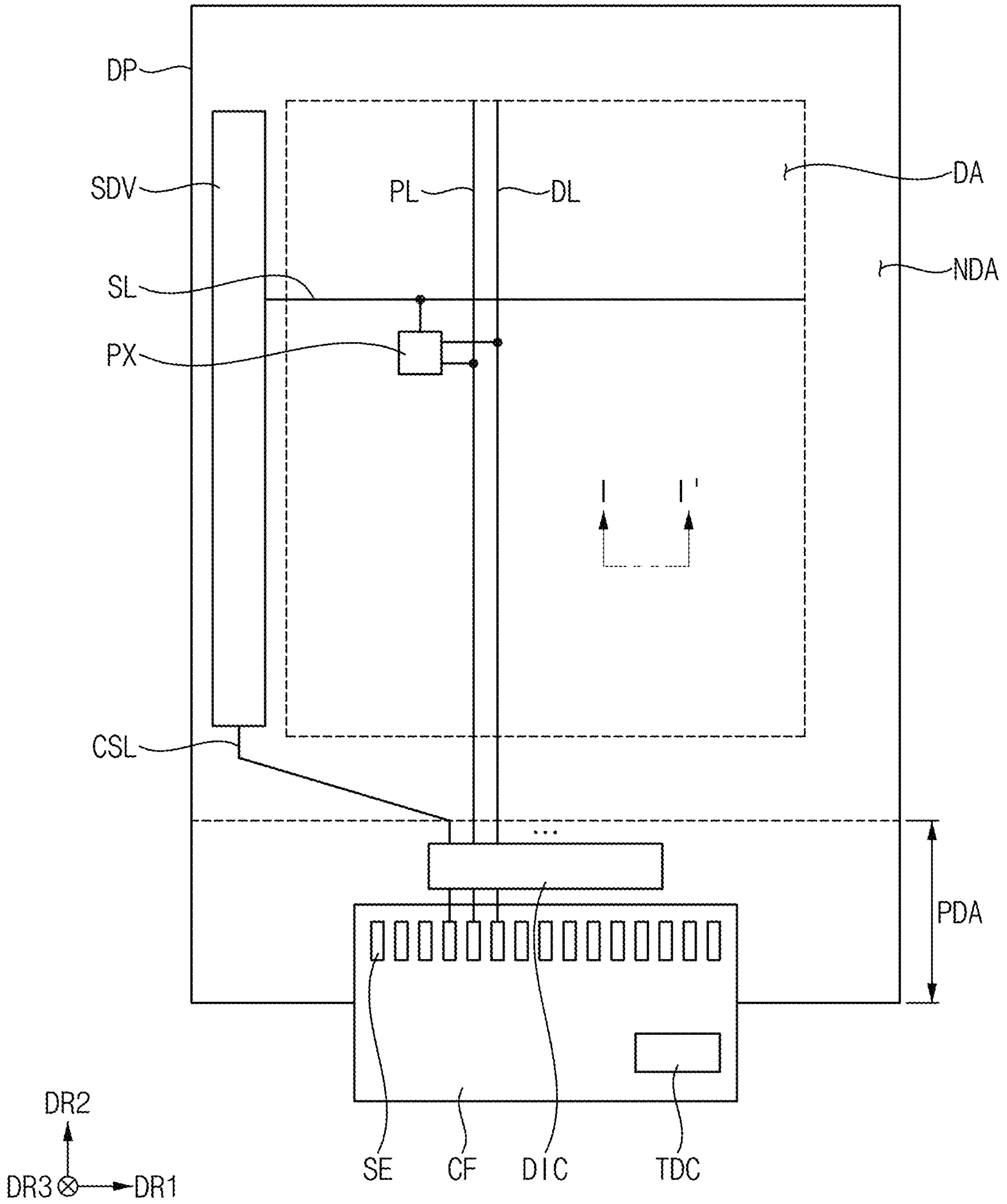
FIG. 4 is a plan view illustrating the display panel of FIG. 3.

FIG. 4 is a plan view illustrating the display panel of FIG. 3.

Referring to FIGS. 1, 3, and 4, as described above, the display device DD may include the display panel DP. In addition, the display device DD may further include a display driving circuit DIC, a connection film CF, and a touch driving circuit TDC. Here, the display panel DP may include a plurality of pixels PX, a scan driver SDV, a scan signal line SL, a scan control line CSL, a power line PL, a data line DL, and a plurality of signal pads SE.

The pixels PX may be arranged in the display area DA. For example, the pixels PX may be arranged in a matrix form or arrangement in a plane parallel to a plane defined by the first direction DR1 and the second direction DR2 in the display area DA. For example, each of the pixels PX may include at least one driving transistor, at least one switching transistor, a light emitting element (e.g., an organic light emitting diode), and at least one capacitor. The scan driver SDV may be located in the non-display area NDA. The scan driver SDV may provide various signals for driving the pixels PX.

The signal pads SE may be located in the pad area PDA. The signal pads SE may be arranged to be spaced apart from each other along the first direction DR1. The signal pads SE may be electrically connected to the display driving circuit DIC through line. Each of the signal pads SE may include metal, alloy, metal nitride, conductive metal oxide, transparent conductive material, and the like. These can be used alone or in combination with each other.

The scan signal line SL, the data line DL, and power line PL may be electrically connected to the pixels PX and may be located in the display area DA. The scan control line CSL may be electrically connected to the scan driver SDV and may be located in the non-display area NDA.

The scan signal line SL may extend in the first direction DR1. The scan signal line SL may be electrically connected to the scan driver SDV. The scan signal line SL may receive a scan signal from the scan driver SDV and provide the scan signal to the pixels PX.

The data line DL may extend in the second direction DR2. The data line DL may be electrically connected to the display driving circuit DIC. The data line DL may receive a data voltage from the display driving circuit DIC and provide the data voltage to the pixels PX.

The power line PL may extend in the second direction DR2. The power line PL may be electrically connected to the display driving circuit DIC. The power line PL may receive the power voltage from the display driving circuit DIC and provide the power voltage to the pixels PX. For example, the power supply voltage may be a high power supply voltage for driving the pixels PX.

The scan control line CSL may be electrically connected to the display driving circuit DIC. Accordingly, the scan control line CSL may receive a control signal from the display driving circuit DIC and provide the control signal to the scan driver SDV.

The display driving circuit DIC may be located in the pad area PDA on the display panel DP. For example, the display driving circuit DIC may be located between the connection film CF and the display area DA in the plan view. The display driving circuit DIC may generate various signals and voltages for driving the pixels PX. For example, the display driving circuit DIC may provide the data voltage to the data line DL, the power voltage to the power line PL, and the control signal to the scan control line CSL.

For example, the display driving circuit DIC may be formed as an integrated circuit and attached to the display panel DP using a chip on plastic (COP) method or a chip on glass (COG) method. Alternatively, the display driving circuit DIC may be attached on the connecting film CF.

The connection film CF may be attached to the signal pads SE of the display panel DP through an adhesive member. The adhesive member may include an anisotropic conductive film. For example, the connection film CF may be a printed circuit board (PCB), a flexible printed circuit board (FPCB), or a flexible film.

The touch driving circuit TDC may be located on the connection film CF. For example, the touch driving circuit TDC may be formed as an integrated circuit and mounted on the connection film CF. The touch driving circuit TDC may be electrically connected to the touch panel TP of FIGS. 3 and 6 through the connection film CF and signal pads SE.

A structure in which the touch driving circuit TDC is located on the connection film CF as illustrated in FIG. 4 may be applied to a structure in which the touch sensing layer TSL of FIG. 3 is directly located on the display panel DP. In this case, the second substrate SUB2 and the sealing member SLM of FIG. 3 may be omitted. However, the embodiments according to the present disclosure are not necessarily limited to this, and when the display device DD has a structure in which the touch panel TP is manufactured separately and located on the display panel DP as illustrated in FIG. 3, the touch driving circuit TDC may mounted on a separate touch circuit board, and the touch circuit board may be attached to a touch pad part (e.g., the touch pad part TPP in FIG. 6) of the touch panel TP through an adhesive film.

The touch driving circuit TDC may apply touch driving signals to touch electrodes of the touch panel TP and measure capacitance values of the touch electrodes. The touch driving signal may be a signal having a plurality of driving pulses. The touch driving circuit TDC may determine whether a touch is input based on capacitance values and calculate touch coordinates where a touch is input.

Figure 5:
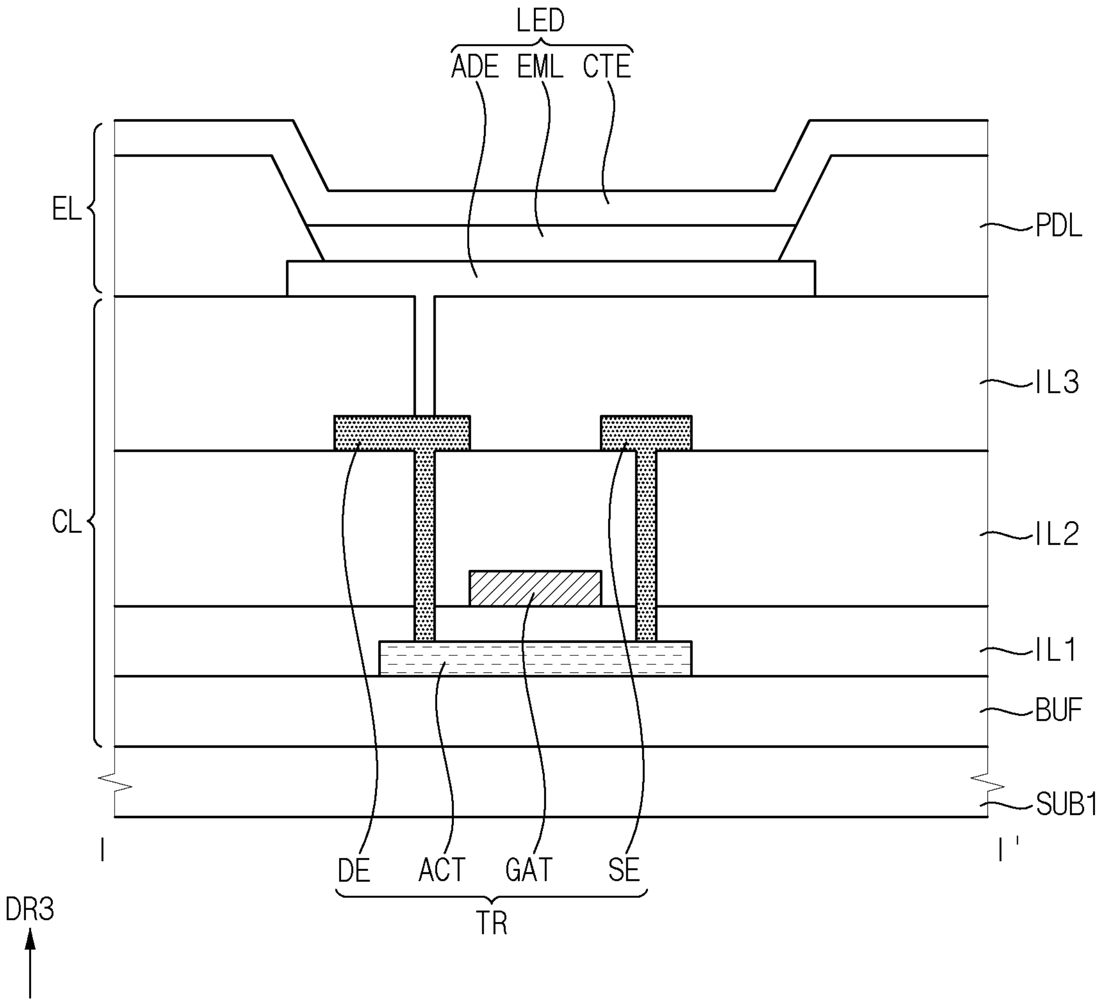
FIG. 5 is a cross-sectional view taken along the line I-I' of FIG. 4.

FIG. 5 is a cross-sectional view taken along the line I-I' of FIG. 4. For example, FIG. 5 is a cross-sectional view illustrating a portion of the display area DA of FIG. 4.

Referring to FIG. 5, the display panel DP includes a first substrate SUB1, a circuit layer CL located on the first substrate SUB1, and a light emitting element layer EL located on the circuit layer CL. Here, the circuit layer CL may include a buffer layer BUF, a transistor TR, a first insulating layer IL1, a second insulating layer IL2, and a third insulating layer IL3. The light emitting element layer EL may include a light emitting element LED and a pixel defining layer PDL.

The buffer layer BUF may be located on the first substrate SUB1. The buffer layer BUF may prevent or reduce instances of contaminants such as metal atoms or impurities diffusing from the first substrate SUB1 to the transistor TR. In addition, the buffer layer BUF may relatively improve the flatness of the surface of the first substrate SUB1 when the surface of the first substrate SUB1 is not uniform. For example, the buffer layer BUF may include an inorganic material such as silicon oxide ($SiO_x$), silicon nitride ($SiN_x$), silicon oxynitride ($SiO_xN_y$), and the like. These can be used alone or in combination with each other.

The active pattern ACT may be located on the buffer layer BUF. The active pattern ACT may include a metal oxide semiconductor, an inorganic semiconductor (e.g., amorphous silicon, poly silicon), or an organic semiconductor. The active pattern ACT may include a source region, a drain region, and a channel region located between the source region and the drain region.

The metal oxide semiconductor may include. a binary compound ($AB_x$), a ternary compound ($AB_xC_y$), a quaternary compound ($AB_xC_yD_z$), and the like containing indium (In), zinc (Zn), gallium (Ga), tin (Sn), titanium (Ti), aluminum (Al), hafnium (Hf), zirconium (Zr), magnesium (Mg), and the like. For example, the metal oxide semiconductor may include zinc oxide ($ZnO_x$), gallium oxide ($GaO_x$), tin oxide ($SnO_x$), indium oxide ($InO_x$), indium gallium oxide (IGO), indium zinc oxide (IZO), indium tin oxide. (ITO), indium zinc tin oxide (IZTO), indium gallium zinc oxide (IGZO), and the like. These can be used alone or in combination with each other.

The first insulating layer IL1 may be located on the buffer layer BUF. The first insulating layer IL1 may sufficiently cover the active pattern ACT and may have a substantially flat upper surface without creating a step around the active pattern ACT. Alternatively, the first insulating layer IL1 may cover the active pattern ACT and may be arranged along the profile of the active pattern ACT with a uniform thickness. For example, the first insulating layer IL1 may include an inorganic material such as silicon oxide, silicon nitride, silicon oxynitride, silicon carbide ($SiC_x$), silicon oxycarbide ($SiO_xC_y$), and the like. These can be used alone or in combination with each other.

The gate electrode GAT may be located on the first insulating layer IL1. The gate electrode GAT may overlap the channel area of the active pattern ACT. The gate electrode GAT may include metal, alloy metal nitride, conductive metal oxide, transparent conductive material, and the like. Examples of the metal may include silver (Ag), molybdenum (Mo), aluminum (Al), tungsten (W), copper (Cu), nickel (Ni), chromium (Cr), titanium (Ti), tantalum (Ta), platinum (Pt), scandium (Sc), and the like. Examples of the conductive metal oxide include indium tin oxide, indium zinc oxide, and the like. In addition, examples of the metal nitride may include aluminum nitride ($AlN_x$), tungsten nitride ($WN_x$), chromium nitride ($CrN_x$), and the like. Each of these can be used alone or in combination with each other.

The second insulating layer IL2 may be located on the first insulating layer IL1. The second insulating layer IL2 may sufficiently cover the gate electrode GAT and may have a substantially flat upper surface without creating steps around the gate electrode GAT. Alternatively, the second insulating layer IL2 may cover the gate electrode GAT and may be formed with a uniform thickness along the profile of each gate electrode GAT. For example, the second insulating layer IL2 may include an inorganic material such as silicon oxide, silicon nitride, silicon oxynitride, silicon carbide, silicon oxycarbide, and the like. These can be used alone or in combination with each other.

The source electrode SE and the drain electrode DE may be located on the second insulating layer IL2. The source electrode SE may be connected to the source region of the active pattern ACT through a contact hole penetrating a first portion of the first insulating layer IL1 and the second insulating layer IL2. The drain electrode DE may be connected to the drain region of the active pattern ACT through a contact hole penetrating a second portion of the first insulating layer IL1 and the second insulating layer IL2. For example, each of the source electrode SE and the drain electrode DE may include a metal, alloy, metal nitride, conductive metal oxide, transparent conductive material, and the like. These can be used alone or in combination with each other.

Accordingly, the transistor TR including the active pattern ACT, the gate electrode GAT, the source electrode SE, and the drain electrode DE may be located in the display area DA on the first substrate SUB1.

The third insulating layer IL3 may be located on the second insulating layer IL2. The third insulating layer IL3 may sufficiently cover the source electrode SE and the drain electrode DE. The third insulating layer IL3 may include an inorganic material or an organic material. For example, the third insulating layer IL3 may include an organic material such as phenolic resin, polyacrylates resin, polyimides resin, polyamides resin, siloxane resin, epoxy resin, and the like. These can be used alone or in combination with each other.

The anode electrode ADE may be located on the third insulating layer IL3. The anode electrode ADE may be connected to the drain electrode DE (or source electrode SE) of the transistor TR through a contact hole penetrating the third insulating layer IL3. For example, the anode electrode ADE may include metal, alloy, metal nitride, conductive metal oxide, transparent conductive material, and the like. These can be used alone or in combination with each other. According to some embodiments, the anode electrode ADE may have a layered structure including ITO/Ag/ITO.

The pixel defining layer PDL may be located on the third insulating layer IL3. The pixel defining layer PDL may cover the edge of the anode electrode ADE. The pixel defining layer PDL may include an organic material or an organic material. For example, the pixel defining layer PDL may include an organic material such as epoxy resin, siloxane resin, and the like. These can be used alone or in combination with each other. According to some embodiments, the pixel defining layer PDL may include an organic material containing a light blocking material such as black pigment, black dye, and the like.

The light emitting layer EML may be located on the anode electrode ADE. The light emitting layer EML may include an organic material that emits light of a preset color. For example, the light emitting layer EML may include an organic material that emits red light, green light, or blue light.

The cathode electrode CTE may be located on the light emitting layer EML and the pixel defining layer PDL. For example, the cathode electrode CTE may include metal, alloy, metal nitride, conductive metal oxide, transparent conductive material, and the like. These can be used alone or in combination with each other.

Figure 6:
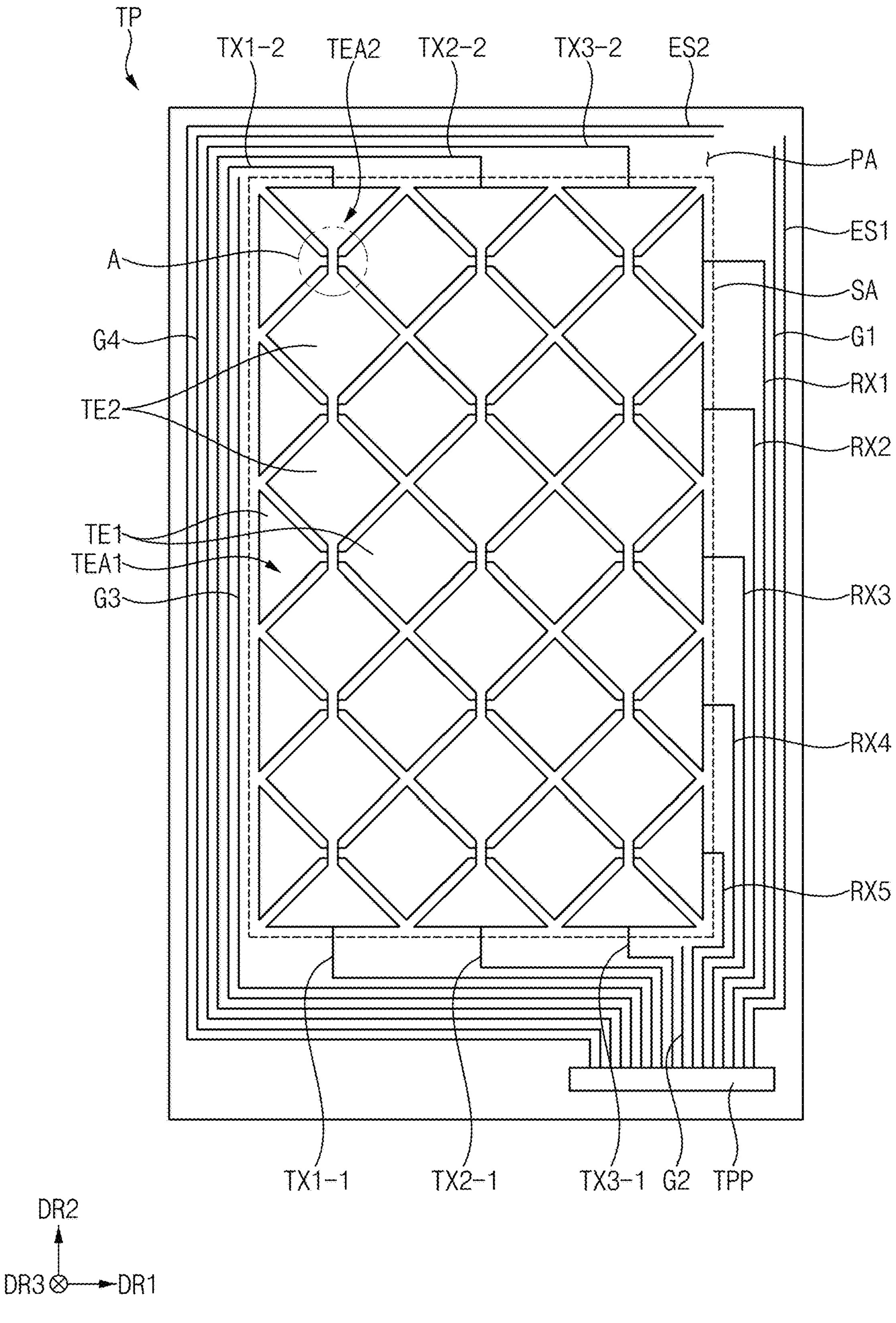
FIG. 6 is a plan view illustrating the touch panel of FIG. 3.
Figure 7:
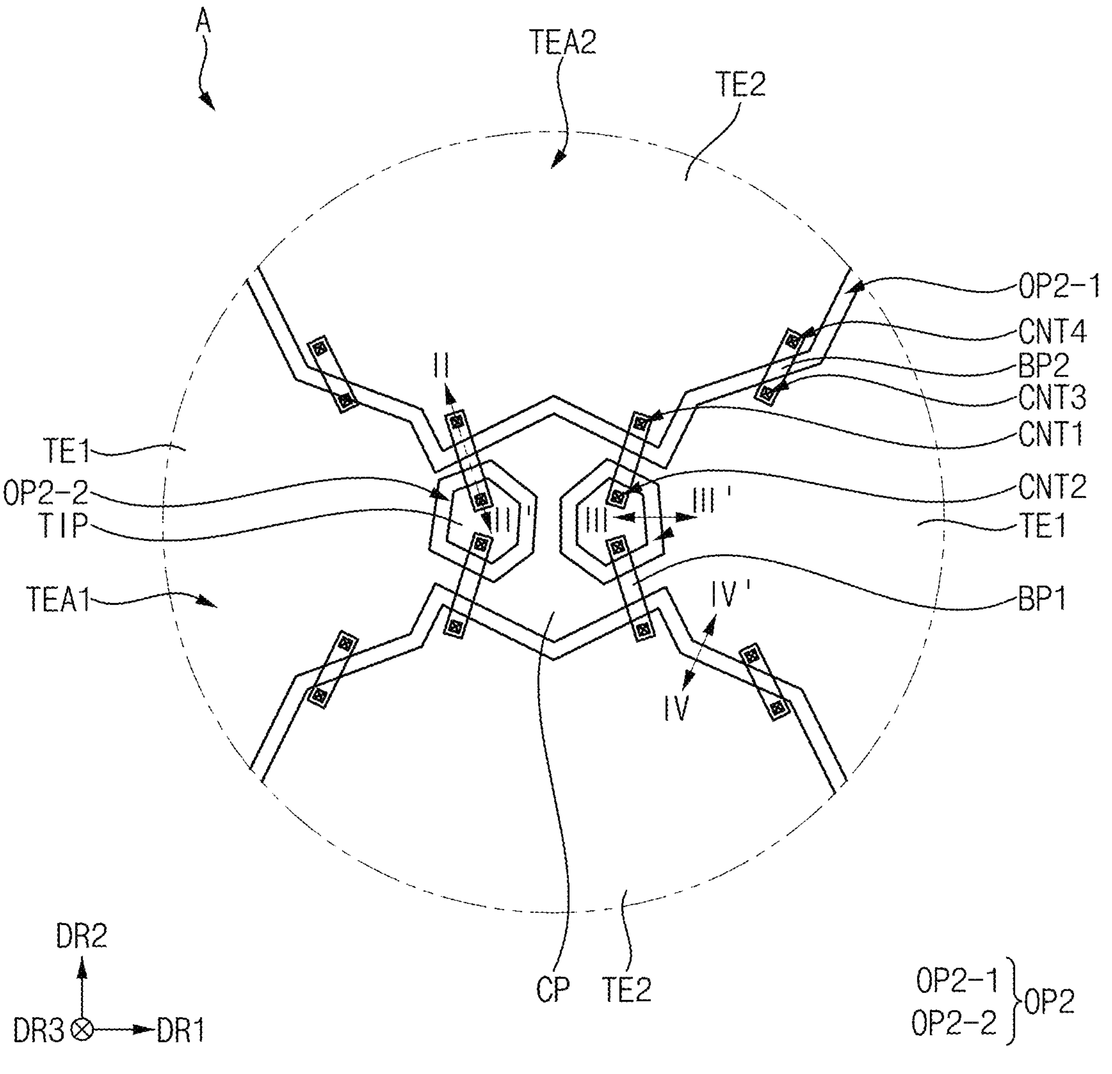
FIG. 7 is an enlarged plan view of area A of FIG. 6.

FIG. 6 is a plan view illustrating the touch panel of FIG. 3. FIG. 7 is an enlarged plan view of area A of FIG. 6.

Referring to FIGS. 3, 6, and 7, the touch panel TP may include a sensing area SA for detecting a user's touch and a peripheral area PA where the user's touch is not detected. The peripheral area PA may be located around the sensing area SA. For example, the peripheral area PA may entirely surround the sensing area SA.

The sensing area SA may correspond to the display area DA of FIGS. 1 and 4, and the peripheral area PA may correspond to the non-display area NDA of FIGS. 1 and 4. That is, the sensing area SA may overlap the display area DA, and the peripheral area PA may overlap the non-display area NDA. Alternatively, the sensing area SA may partially overlap the non-displaying area NDA.

The touch panel TP may include a plurality of first touch electrode arrays TEA1, a plurality of second touch electrode arrays TEA2, a plurality of driving lines TX1-1, TX2-1, TX3-1, TX1-2, TX2-2, and TX3-2, a plurality of sensing lines RX1, RX2, RX3, and RX4, a plurality of guard lines G1, G2, G3, and G4, a plurality of ground lines ES1 and ES2, and the touch pad part TPP.

The first touch electrode arrays TEA1 and the second touch electrode arrays TEA2 may be located in the sensing area SA. The plurality of driving lines TX1-1, TX2-1, TX3-1, TX1-2, TX2-2, and TX3-2, the plurality of sensing lines RX1, RX2, RX3, and RX4, the plurality of guard lines G1, G2, G3, and G4, the plurality of ground lines ES1 and ES2, and the touch pad part TPP may be located in the peripheral area PA.

Each of the first touch electrode arrays TEA1 may extend in the first direction DR1, and the first touch electrode arrays TEA1 may be repeatedly arranged along the second direction DR2.

In addition, each of the second touch electrode arrays TEA2 may extend in the second direction DR2, and the second touch electrode arrays TEA2 may be repeatedly arranged along the first direction DR1. Here, the term "extend" may mean extending in a direction in which a plurality of touch electrodes that are not physically connected to each other are located.

The first touch electrode array TEA1 may include a plurality of first touch electrodes TE1 and a connection portion CP, and the second touch electrode array TEA2 may include a plurality of second touch electrodes TE2. In the sensing area SA, the touch panel TP may further include an island electrode pattern TIP located between adjacent the second touch electrodes TE2, a first bridge pattern BP1 connecting the second touch electrodes TE2 and the island electrode pattern TIP, and a second bridge pattern BP2 connecting the first and second touch electrodes TE1 and TE2 adjacent to each other.

According to some embodiments, the first touch electrode arrays TEA1, the second touch electrode arrays TEA2, and the island electrode pattern TIP may include the same material and be located in the same layer. That is, the first touch electrode arrays TEA1, the second touch electrode arrays TEA2, and the island electrode pattern TIP may be formed through the same process.

The first touch electrode arrays TEA1, the second touch electrode arrays TEA2, and the island electrode pattern TIP may include a conductive metal oxide. For example, the first touch electrode arrays TEA1, the second touch electrode arrays TEA2, and the island electrode pattern TIP may include indium gallium oxide (IGO), indium zinc oxide (IZO), indium tin oxide (ITO), indium zinc tin oxide (IZTO), indium gallium zinc oxide (IGZO), and the like. These can be used alone or in combination with each other. According to some embodiments, the first touch electrode arrays TEA1, the second touch electrode arrays TEA2, and the island electrode pattern TIP may include indium tin oxide (ITO).

According to some embodiments, the first bridge pattern BP1 and the second bridge pattern BP2 may include the same material and be located in the same layer. That is, the first bridge pattern BP1 and the second bridge pattern BP2 may be formed through the same process.

The first bridge pattern BP1 and the second bridge pattern BP2 may include a conductive material. According to some embodiments, the first bridge pattern BP1 and the second bridge pattern BP2 may include molybdenum (Mo), aluminum (Al), platinum (Pt), silver (Ag), gold (Au), nickel. (Ni), titanium (Ti), tantalum (Ta), copper (Cu), niobium (Nb), and the like. These can be used alone or in combination with each other. Each of the first bridge pattern BP1 and the second bridge pattern BP2 may be formed as a single layer or multilayer. According to some embodiments, the first bridge pattern BP1 and the second bridge pattern BP2 may include molybdenum-niobium (MoNb).

One of the first touch electrode TE1 and the second touch electrode TE2 may be a driving electrode, and the other may be a sensing electrode. In the following description, the case where the first touch electrodes TE1 are sensing electrodes and the second touch electrodes TE2 are driving electrodes will be described as an example.

The first touch electrodes TE1 may be repeatedly arranged along the first direction DR1 and may be electrically connected to each other along the first direction DR1. For example, adjacent first touch electrodes TE1 may be connected to each other through the connection part CP located between the adjacent first touch electrodes TE1. The connection portion CP may be formed integrally with the first touch electrodes TE1.

For example, some of the first touch electrodes TE1 may have a diamond shape in the plan view. In this case, another portion of the first touch electrodes TE1 adjacent to an edge of the sensing area SA may have a diamond shape cut in half in the plan view.

The second touch electrodes TE2 may be repeatedly arranged along the second direction DR2 and may be electrically connected to each other along the first direction DR1. For example, at least one island electrode pattern TIP may be located between adjacent second touch electrodes TE2. The island electrode pattern TIP and the adjacent second touch electrodes TE2 may be connected through the first bridge pattern BP1. The first bridge pattern BP1 may be connected to the second touch electrode TE2 through a first contact hole CNT1 and may be connected to the island electrode pattern TIP through a second contact hole CNT2.

For example, two island electrode patterns TIP and four first bridge patterns BP1 may be located between two adjacent second touch electrodes TE2. In this case, even if one of the four first bridge patterns BP1 is disconnected, the adjacent second touch electrodes TE2 may be connected to each other. However, embodiments according to the present disclosure are not limited thereto.

For example, some of the second touch electrodes TE2 may have a diamond shape in the plan view. In this case, another portion of the second touch electrodes TE2 adjacent to the edge of the sensing area SA may have a diamond shape cut in half in the plan view.

The adjacent first and second touch electrodes TE1 and TE2 may be connected to each other through the second bridge pattern BP2. For example, the second bridge pattern BP2 may be connected to the first touch electrode TE1 through a third contact hole CNT3 and the second touch electrode TE2 through a fourth contact hole CNT4. The second bridge pattern BP2 may allow adjacent second touch electrodes TE2 to be electrically connected even if a portion of the first bridge pattern BP1 is disconnected. Alternatively, the second bridge pattern BP2 may be omitted.

For example, four second bridge patterns BP2 may be arranged based on two adjacent first touch electrodes TE1 and two second touch electrodes TE2. However, embodiments according to the present disclosure are not limited thereto.

The first touch electrode arrays TEA1, the second touch electrode arrays TEA2, and the island electrode pattern TIP may be physically separated from each other, and a gap may exist between the first touch electrode arrays TEA1, the second touch electrode arrays TEA2, and the island electrode pattern TIP. That is, a second opening OP2 may be defined between the first touch electrode arrays TEA1, the second touch electrode arrays TEA2, and the island electrode pattern TIP. According to some embodiments, a second-first opening OP2-1 may be defined between the first touch electrode array TEA1 and the second touch electrode array TEA2 adjacent to each other, and a second-second opening OP2-2 may be defined between the first touch electrode array TEA1 and the island electrode pattern TIP adjacent to each other.

The driving lines TX1-1, TX2-1, TX3-1, TX1-2, TX2-2, and TX3-2 may be connected to the second touch electrode arrays TEA2. For example, the driving lines TX1-1, TX2-1, TX3-1, TX1-2, TX2-2, and TX3-2 may include the first driving lines TX1-1, TX2-1, and TX3-1 connected to lower ends of the second touch electrode arrays TEA2 and the second driving lines TX1-2, TX2-2, and TX3-2 connected to upper ends of the second touch electrode arrays TEA2. The first driving lines TX1-1, TX2-1, and TX3-1 may extend from the touch pad part TPP in the second direction DR2 and be connected to the lower ends of the second touch electrode arrays TEA2. The second driving lines TX1-2, TX2-2, and TX3-2 may extend from the touch pad part TPP in the second direction DR2, bypass the left edge of the sensing area SA, and be connected to the upper ends of the second touch electrode arrays TEA2.

The sensing lines RX1, RX2, RX3, RX4, and RX5 may be connected to the first touch electrode arrays TEA1. For example, one of the sensing lines RX1, RX2, RX3, RX4, and RX5 may be connected to one first touch electrode array TEA1. Each of the sensing lines RX1, RX2, RX3, RX4, and RX5 may extend from the touch pad part TPP in the second direction DR2, extend toward the right edge of the sensing area SA, and be connected to the right ends of the first touch electrode arrays TEA1.

A touch driving signal may be applied to the driving lines TX1-1, TX2-1, TX3-1, TX1-2, TX2-2, and TX3-2 through the touch pad part TPP. Accordingly, the touch driving signal may be provided to the second touch electrode arrays TEA2. A touch sensing signal may be applied to the first touch electrode arrays TEA1, and the touch sensing signal may be provided to the sensing lines RX1, RX2, RX3, RX4, and RX5.

The ground lines ES1 and ES2 may be located on the outermost portions of the driving lines TX1-1, TX2-1, TX3-1, TX1-2, TX2-2, and TX3-2 and the sensing lines RX1, RX2, RX3, RX4, and RX5. The ground lines ES1 and ES2 may include the first ground line ES1 and a second ground line ES2. The first and second ground lines ES1 and ES2 may surround the sensing area SA, the driving lines TX1-1, TX2-1, TX3-1, TX1-2, TX2-2, and TX3-2, and the sensing lines RX1, RX2, RX3, RX4, and RX5 in a ring shape in the plan view. The first ground line ES1 and the second ground line ES2 may not be connected to each other.

The first ground line ES1 may cover a portion of the sensing lines RX1, RX2, RX3, RX4, and RX5 located on the right side of the sensing area SA and a portion of the sensing lines RX1, RX2, RX3, RX4, and RX5 extending from the lower side of the sensing area SA in the first direction DR1.

The second ground line ES2 may cover a portion of the driving lines TX1-1, TX2-1, TX3-1, TX1-2, TX2-2, and TX3-2 located on the left side of the sensing area SA and a portion of the driving lines TX1-1, TX2-1, TX3-1, TX1-2, TX2-2, and TX3-2 extending from the upper and lower sides of the sensing area SA in the first direction DR1.

A first reference voltage signal may be applied to each of the first and second ground lines ES1 and ES2. Each of the first and second ground lines ES1 and ES2 may relieve electrostatic shock that may be applied to the driving lines TX1-1, TX2-1, TX3-1, TX1-2, TX2-2, and TX3-2, the sensing lines RX1, RX2, RX3, RX4, and RX5, the first touch electrode arrays TEA1, and the second touch electrode arrays TEA2 from the outside.

The guard lines G1, G2, G3, and G4 may be located between the driving lines TX1-1, TX2-1, TX3-1, TX1-2, TX2-2, and TX3-2 and the sensing lines RX1, RX2, RX3, RX4, and RX5 and/or located between the driving lines TX1-1, TX2-1, TX3-1, TX1-2, TX2-2, and TX3-2 and the sensing lines RX1, RX2, RX3, RX4, and RX5 each ground line ES1 and ES2. The guard lines G1, G2, G3, and G4 may include the first guard line G1, the second guard line G2, the third guard line G3, and the fourth guard line G4.

The first guard line G1 may be located between the sensing lines RX1, RX2, RX3, RX4, and RX5 and the first ground line ES1. The second guard line G2 may be located between the driving lines TX1-1, TX2-1, TX3-1, TX1-2, TX2-2, and TX3-2 and the sensing lines RX1, RX2, RX3, RX4, and RX5. The third guard line G3 may be located between the first driving lines TX1-1, TX2-1, and TX3-1 and the second driving lines TX1-2, TX2-2, and TX3-2. The fourth guard line G4 may be located between the second driving lines TX1-2, TX2-2, and TX3-2 and the second ground line ES2.

A second reference voltage signal may be applied to each of the first, second, third, and fourth guard lines G1, G2, G3, and G4. Each of the first, second, third, and fourth guard lines G1, G2, G3, and G4 may prevent or reduce signal interference that may occur between adjacent lines. For example, the first guard line G1 may prevent or reduce mutual signal interference between the sensing lines RX1, RX2, RX3, RX4, and RX5 and the first ground line ES1, the second guard line G2 may prevent or reduce mutual signal interference between the driving lines TX1-1, TX2-1, TX3-1, TX1-2, TX2-2, and TX3-2 and the sensing lines RX1, RX2, RX3, RX4, and RX5, the third guard line G3 may prevent or reduce mutual signal interference between the first driving lines TX1-1, TX2-1, and TX3-1 and the second driving lines TX1-2, TX2-2, and TX3-2, and the fourth guard line G4 may prevent or reduce mutual signal interference between the second driving lines TX1-2, TX2-2, and TX3-2 and the second ground line ES2.

Figure 8:
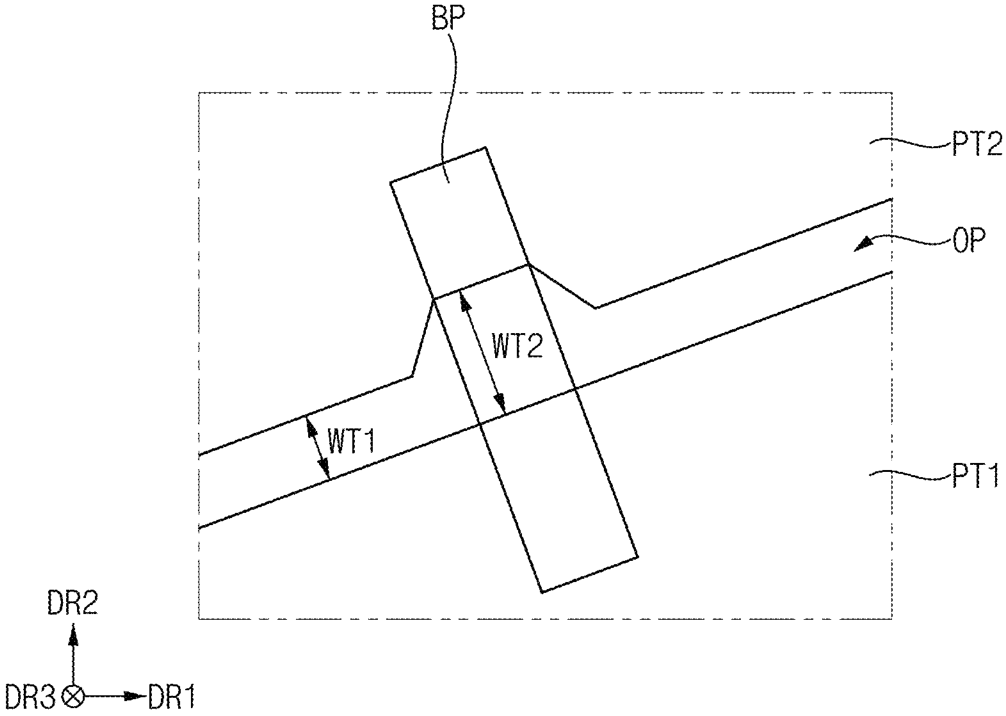
FIG. 8 is a plan view for explaining a width of an opening defined between a first pattern and a second pattern.

FIG. 8 is a plan view for explaining a width of an opening defined between a first pattern and a second pattern.

Referring to FIG. 8, a first pattern PT1 corresponds to the first touch electrode array TEA1 of FIG. 7, and the second pattern PT2 corresponds to the second touch electrode array TEA2 or the island electrode pattern TIP of FIG. 7, and the bridge pattern BP corresponds to the first bridge pattern BP1 or the second bridge pattern BP2 of FIG. 7.

The first pattern PT1 and the second pattern PT2 may be connected to each other through a bridge pattern BP. The first pattern PT1 and the second pattern PT2 may be physically separated from each other, and a gap may exist between the first pattern PT1 and the second pattern PT2. That is, an opening OP may be defined between the first pattern PT1 and the second pattern PT2.

A width of the opening OP may vary depending on the location. For example, a width WT2 of a portion of the opening OP overlapping the bridge pattern BP may be different from a width WT1 of a portion of the opening OP that does not overlap the bridge pattern BP. According to some embodiments, the width WT2 of the portion of the opening OP overlapping the bridge pattern BP may be greater than the width WT1 of the portion of the opening OP that does not overlap the bridge pattern BP. Accordingly, the risk of an electrical short circuit due to metal residual films (e.g., metal residual films MR of FIG. 9) remaining in the opening OP overlapping the bridge pattern BP may be prevented, minimized, or reduced.

For example, a portion of the opening OP overlapping the bridge pattern BP may have a shape protruding toward the second pattern PT2. However, embodiments according to the present disclosure are not limited thereto.

Figure 9:
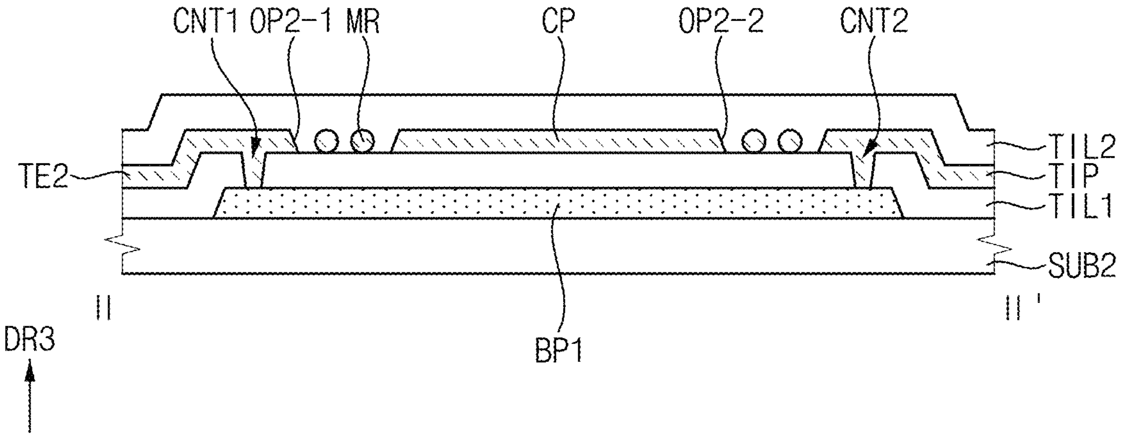
FIG. 9 is a cross-sectional view taken along the line II-II' of FIG. 7.
Figure 10:
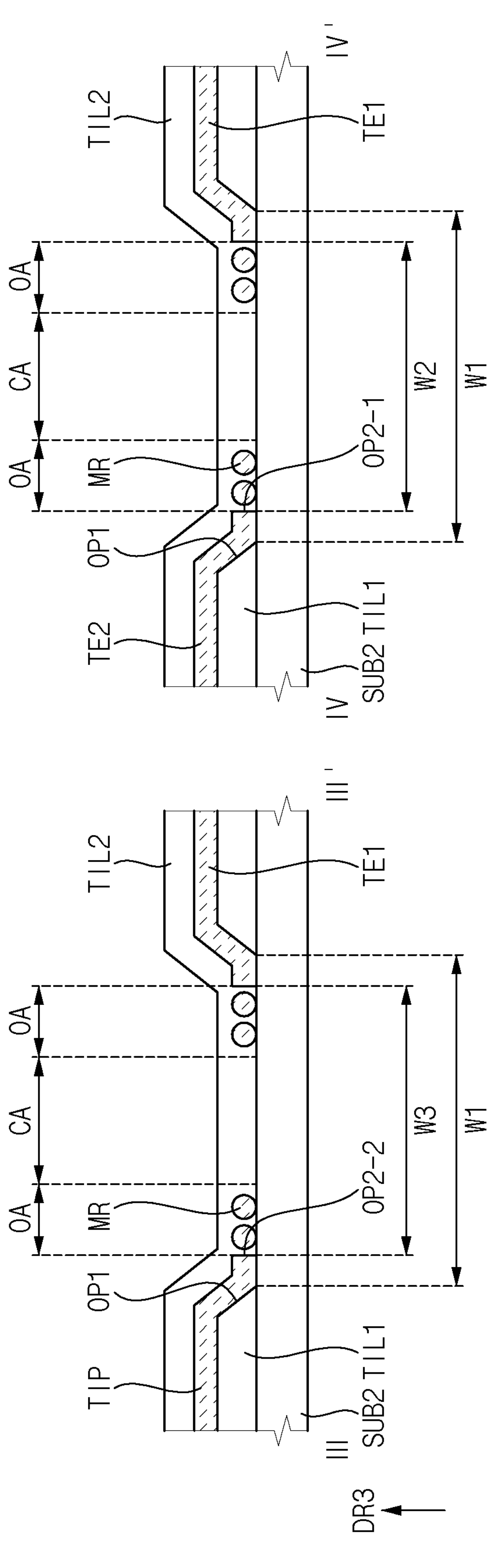
FIG. 10 is a cross-sectional view illustrating an example of a cross section taken along the line III-III' and the line IV-IV' of FIG. 7.

FIG. 9 is a cross-sectional view taken along the line II-II' of FIG. 7. FIG. 10 is a cross-sectional view illustrating an example of a cross section taken along the line III-III' and the line IV-IV' of FIG. 7. Hereinafter, the stacked structure of the first bridge pattern BP1, the first touch electrode TE1, the second touch electrode TE2, and the island electrode pattern TIP will be described.

Referring to FIGS. 7, 9, and 10, the touch panel TP may include the sensing area SA and the peripheral area SA. Accordingly, the second substrate SUB2 may also include the sensing area SA and the peripheral area SA.

The first bridge pattern BP1 may be located on the second substrate SUB2. A first touch insulating layer TIL1 may be located on the second substrate SUB2 and the first bridge pattern BP1. The first touch insulating layer TIL1 may entirely cover the first bridge pattern BP1. Likewise, the first touch insulating layer TIL1 may entirely cover the second bridge pattern BP2 of FIG. 7. For example, the first touch insulating layer TIL1 may include silicon oxide, silicon nitride, silicon oxynitride, and the like. These can be used alone or in combination with each other. According to some embodiments, the first touch insulating layer TIL1 may include silicon dioxide ($SiO_2$).

According to some embodiments, in the sensing area SA, at least one first opening OP1 exposing at least a portion of the second substrate SUB2 may be defined in the first touch insulating layer TIL1. For example, the first opening OP1 may extend along the second-first opening OP2-1 and the second-second opening OP2-2. However, the first opening OP1 may not be formed in a portion of the second-first opening OP2-1 and the second-second opening OP2-2 overlapping the first and second bridge patterns BP1 and BP2.

The first touch electrode TE1, the second touch electrode TE2, the connection portion CP, and the island electrode pattern TIP may be located on the first touch insulating layer TIL1. The first touch electrode TE1 may be connected to the first bridge pattern BP1 through the second contact hole CNT2 penetrating a portion of the first touch insulating layer TIL1, and the second touch electrode TE2 may be connected to may be connected to the first bridge pattern BP1 through the first contact hole CNT1 penetrating a portion of the first touch insulating layer TIL1.

As described above, the second-first opening OP2-1 may be defined between the adjacent first and second touch electrodes TE1 and TE2. In addition, the second-second opening OP2-2 may be defined between the adjacent first touch electrode TE1 and the island electrode pattern TIP and between the adjacent connection portion CP and the island electrode pattern TIP.

Each of the second-first opening OP2-1 and the second-second opening OP2-2 may overlap the first opening OP1 in the plan view. A width W2 of the second-first opening OP2-1 may be different from a width W1 of the first opening OP1, and a width W3 of the second-second opening OP2-2 may be different from the width W1 of the first opening OP1. According to some embodiments, the width W1 of the first opening OP1 may be greater than each of the width W2 of the second-first opening OP2-1 and the width W3 of the second-second opening OP2-2. In this case, each of the first touch electrode TE1, the second touch electrode TE2, and the island electrode pattern TIP may cover a side surface of the first touch insulating layer TIL1 exposed by the first opening OP1. Likewise, the connection portion CP may cover the side surface of the first touch insulating layer TIL1 exposed by the first opening OP1. However, embodiments according to the present disclosure are not limited thereto.

For example, each of the width W2 of the second-first opening OP2-1 and the width W3 of the second-second opening OP2-2 may have a range of several micrometers (μm). When each of the width W2 of the second-first opening OP2-1 and the width W3 of the second-second opening OP2-2 are about 10 micrometers (μm) or more, the second-first opening OP2-1 and the second-second opening OP2-2 may be visible to the outside.

According to some embodiments, inside the first opening OP1, the metal residual films MR including the same material as the first and second touch electrode arrays TEA1 and TEA2 may located in an outer area OA of the second-first opening OP2-1 and the metal residual films MR may not be located in a central area CA of the second-first opening OP2-1. Likewise, inside the first opening OP1, the metal residual films MR including the same material as the first and second touch electrode arrays TEA1 and TEA2 may located in the outer area OA of the second-second opening OP2-2 and the metal residual films MR may not be located in the central area CA of the second-second opening OP2-2. Accordingly, the risk of electrical short circuit due to metal residual films MR may be minimized or reduced.

However, in the second-first opening OP2-1 and the second-second opening OP2-2 overlapping the first and second bridge patterns BP1 and BP2, the metal residual films MR may be located on the first touch insulating layer TIL1.

Here, the metal residual films MR refers to patterns that remains without being removed from a metal layer after an etching process of removing the metal layer to form the first touch electrode array TEA1, the second touch electrode array TEA2, and the island electrode pattern TIP. In other words, the metal residual films MR are the patterns that must be removed through the etching process, but cannot be removed.

A second touch insulating layer TIL2 may be located on the first touch electrode TE1, the second touch electrode TE2, the island electrode pattern TIP, and the connection portion CP. The second touch insulating layer TIL2 may cover the first touch electrode TE1, the second touch electrode TE2, the island electrode pattern TIP, and the connection portion CP. In addition, the second touch insulating layer TIL2 may fill the first opening OP1, the second-first opening OP2-1, and the second-second opening OP2-2. For example, the second touch insulating layer TIL2 may include silicon oxide, silicon nitride, silicon oxynitride, and the like. These can be used alone or in combination with each other. According to some embodiments, the second touch insulating layer TIL2 may include silicon dioxide.

Referring again to FIGS. 1, 2, 3, 4, 5, 6, 7, 8, 9, and 10, in embodiments according to the present disclosure, the touch panel TP may include the first touch insulating layer TIL1 defined by at least one first opening OP1 exposing a portion of the second substrate SUB2 in the sensing area SA, the first touch electrode array TEA1 located on the first touch insulating layer TIL1 and including the plurality of first touch electrode TE1 arranged in the first direction DR1, and the second touch electrode array TEA2 located on the first touch insulating layer TIL1 and including the plurality of second touch electrode TE2 arranged in the second direction DR2. The second opening OP2 overlapping the first opening OP1 in the plan view may be defined between the first touch electrode array TEA1 and the second touch electrode array TEA2. Accordingly, the risk of electrical short circuit due to the metal residual films MR may be prevented, minimized, or reduced.

FIGS. 11, 12, 13, 14, 15, 16, 17, 18, and 19 are cross-sectional views for explaining a method for manufacturing the touch panel of FIG. 10. Hereinafter, descriptions that overlap with those described with reference to FIGS. 7, 8, and 10 will be omitted or simplified.

Figure 11:
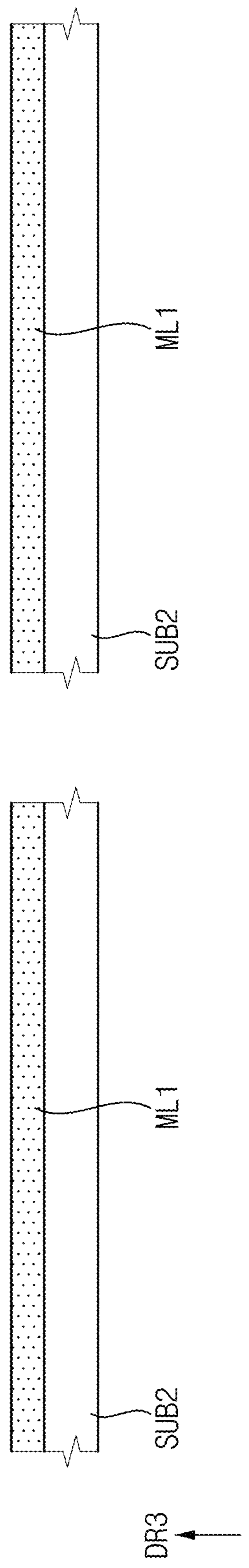
FIGS. 11, 12, 13, 14, 15, 16, 17, 18, and 19 are cross-sectional views for explaining a method for manufacturing the touch panel of FIG. 10.
Figure 12:
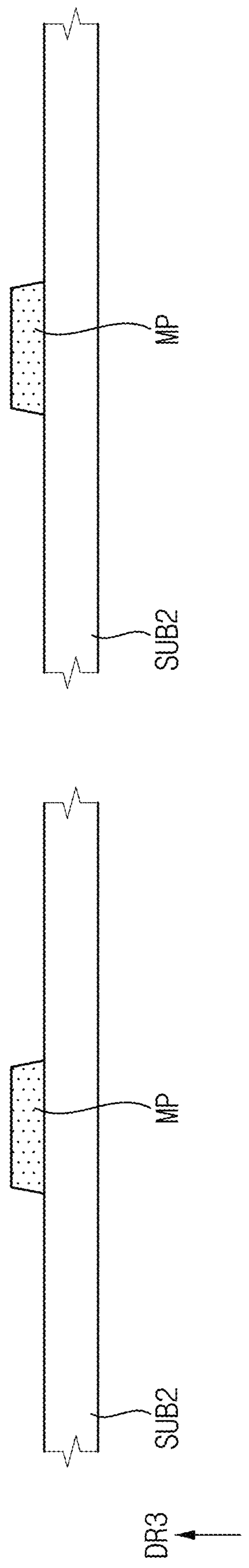

Referring to FIGS. 11 and 12, a first metal layer ML1 may be formed entirely on the second substrate SUB2. For example, the first metal layer ML1 may be formed using molybdenum-niobium.

A metal pattern MP may be formed on the second substrate SUB2 by removing a portion of the first metal layer ML1 through an etching process. Through the etching process, the first and second bridge patterns BP1 and BP2 of FIG. 7 may be formed simultaneously. The metal pattern MP may be formed to extend along an area where the second-first opening OP2-1 and the second-second opening OP2-2 of FIG. 7 are to be formed.

Figure 13:
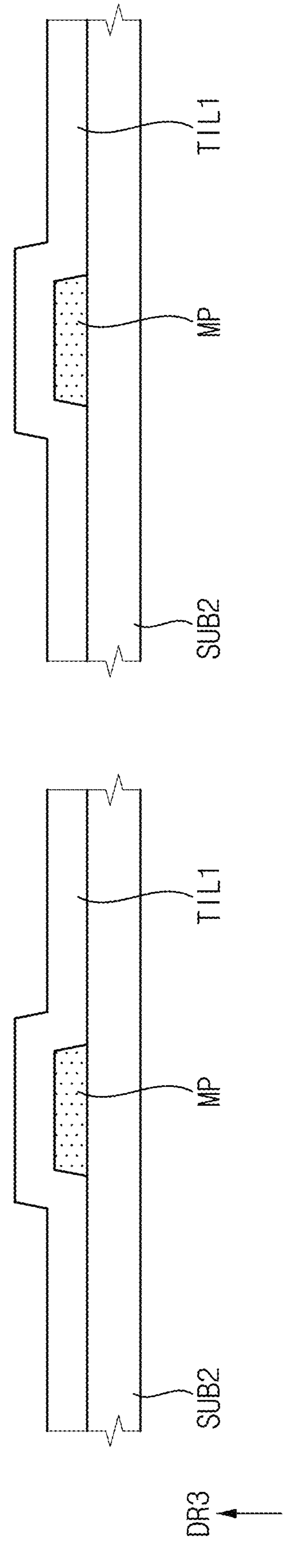
Figure 14:
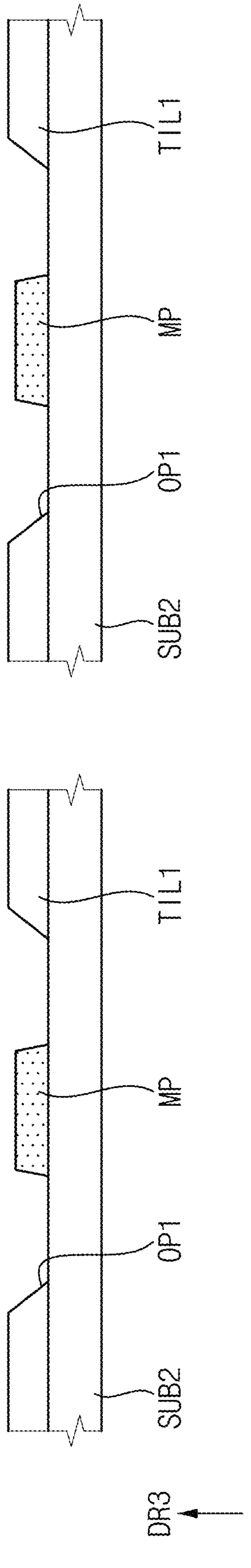

Referring to FIGS. 13 and 14, the first touch insulating layer TIL1 may be formed entirely on the second substrate SUB2 and the metal pattern MP. The first touch insulating layer TIL1 may be formed to cover the metal pattern MP. For example, the first touch insulating layer TIL1 may be formed using silicon dioxide.

A portion of the first touch insulating layer TIL1 may be removed through an etching process to form the first opening OP1 exposing the second substrate SUB2 and the metal pattern MP. The first opening OP1 may be formed to extend along the metal pattern MP. In this case, the first opening OP1 may not expose the first and second bridge patterns BP1 and BP2 of FIG. 7.

Figure 15:
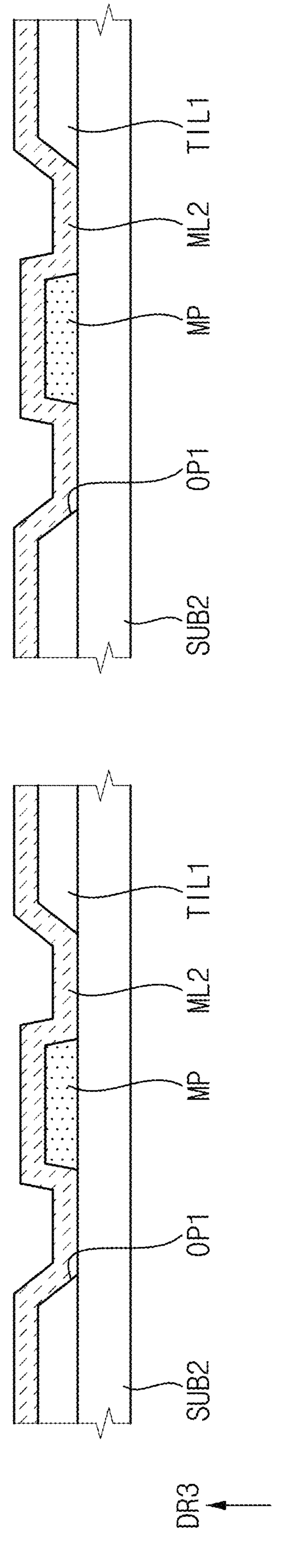

Referring to FIG. 15, the second metal layer ML2 may be entirely formed on the second substrate SUB2, the first touch insulating layer TIL1, and the metal pattern MP. The second metal layer ML2 may be formed to cover the metal pattern MP. For example, the second metal layer ML2 may be formed using indium tin oxide.

Figure 16:
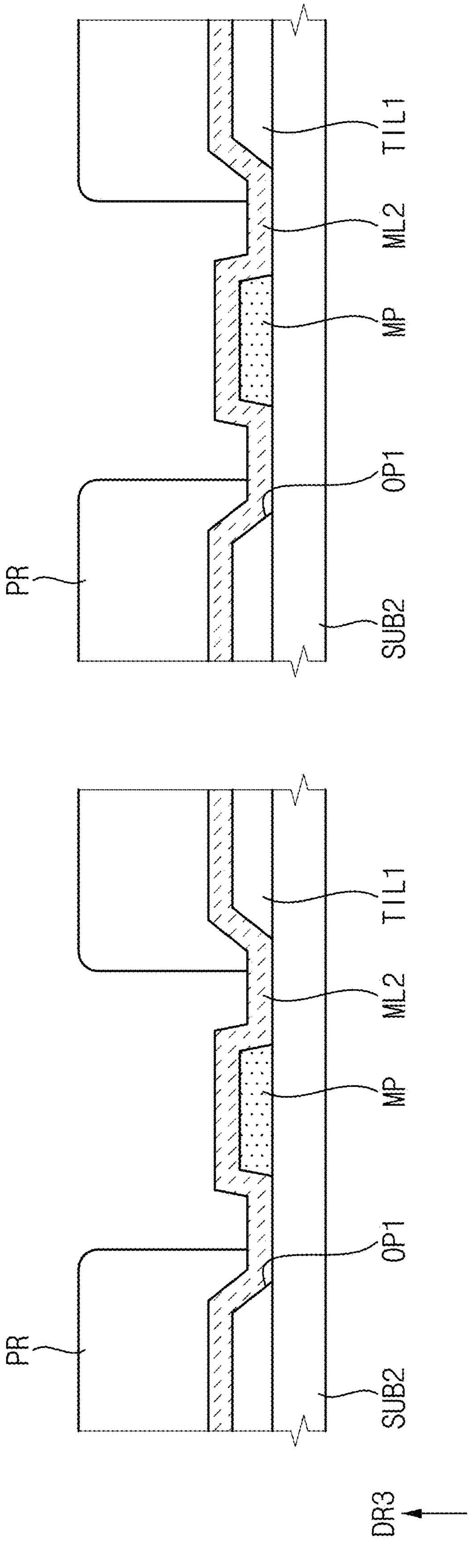
Figure 17:
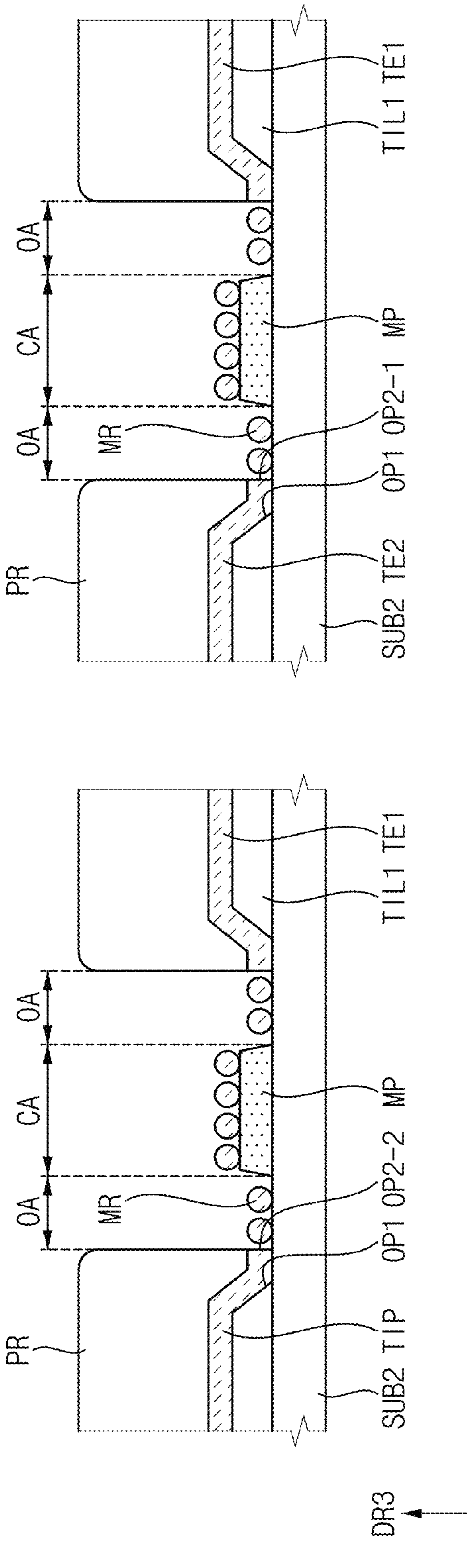

Referring to FIGS. 16 and 17, a photoresist pattern PR may be formed on the second metal layer ML2. The photoresist pattern PR may overlap the first touch insulating layer TIL1 in the plan view and may not overlap the metal pattern MP. For example, the photoresist pattern PR may be formed using positive photoresist. However, embodiments according to the present disclosure are not limited thereto.

Through an etching process, the photoresist pattern PR is used as a mask to remove a portion of the second metal layer ML2 that does not overlap the photoresist pattern PR to form the first touch electrode TE1, the second touch electrode TE2, and the island electrode pattern TIP (i.e., form the first touch electrode array TEA1, the second touch electrode array TEA2, and the island electrode pattern TIP). At the same time, the metal residual films MR may be formed on the second substrate SUB2 and the metal pattern MP.

Figure 18:
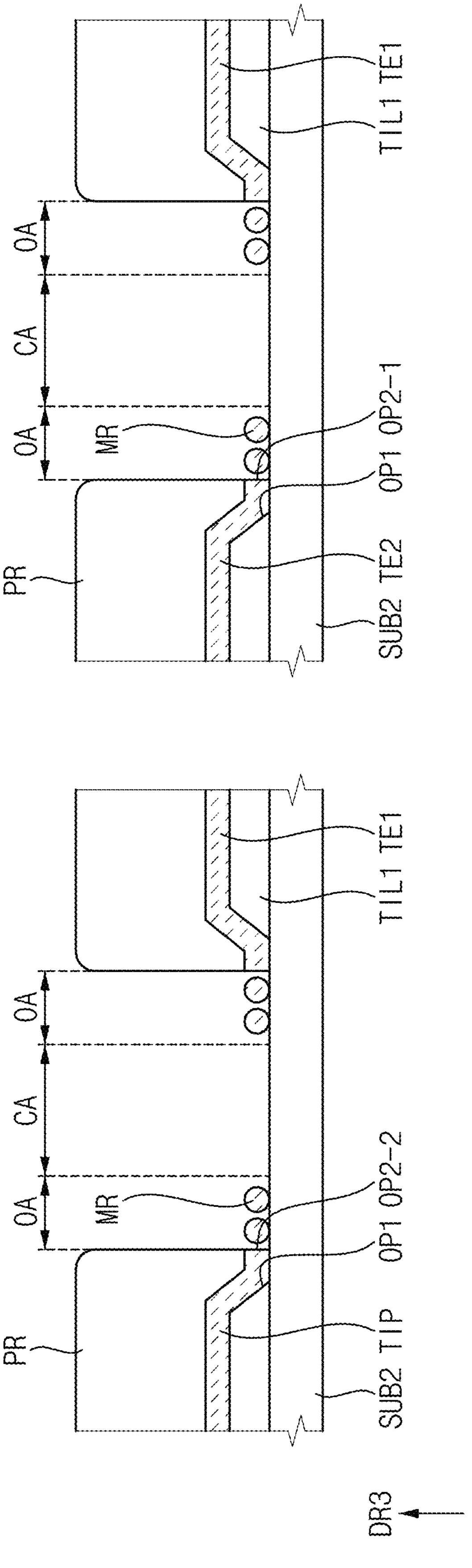

Referring further to FIG. 18, according to some embodiments, the metal pattern MP and the metal residual films MR located on the metal pattern MP may be simultaneously removed using the photoresist pattern PR as a mask. That is, the metal residual films MR located in the central area CA of the second-first opening OP2-1 and the second-second opening OP2-2 may be removed, and the metal residual films MR located in the outer areas OA of the second-first opening OP2-1 and the second-second opening OP2-2 may remain. Accordingly, the risk of electrical short circuit due to the metal residual films MR may be prevented, minimized, or reduced.

Figure 19:
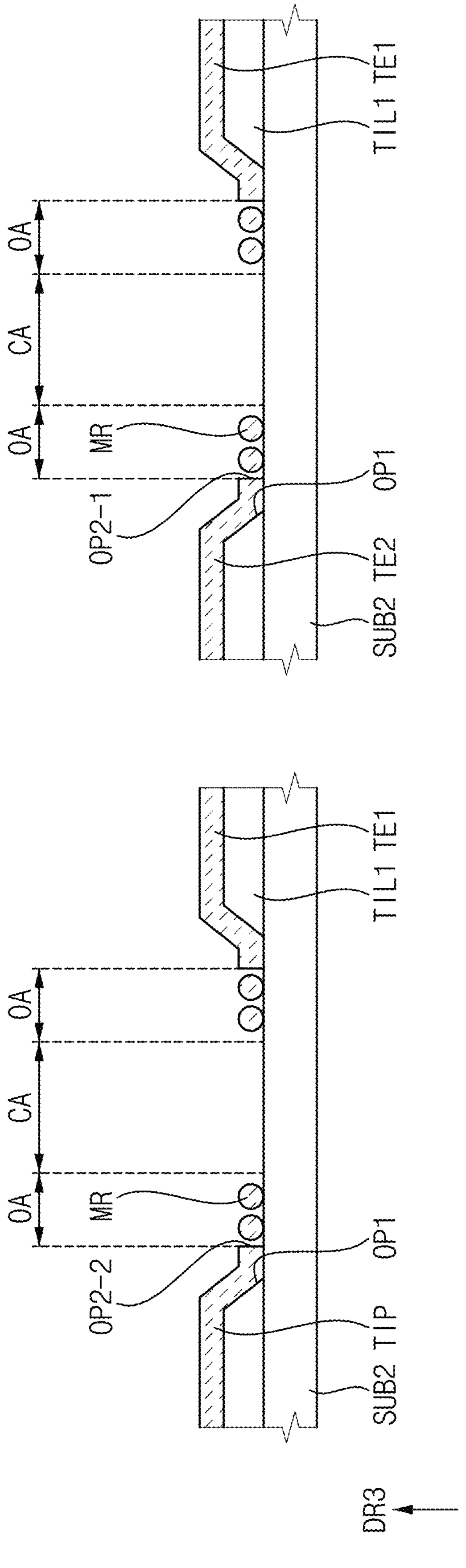

Referring further to FIG. 19, the photoresist pattern PR may be removed.

Referring again to FIG. 10, the second touch insulating layer TIL2 may be formed on the first touch electrode TE1, the second touch electrode TE2, and the island electrode pattern TIP. The second touch insulating layer TIL2 may fill the first opening OP1, the second-first opening OP2-1, and the second-second opening OP2-2. For example, the second touch insulating layer TIL2 may be formed using silicon dioxide.

Accordingly, the touch panel TP illustrated in FIG. 10 may be manufactured.

Figure 20:
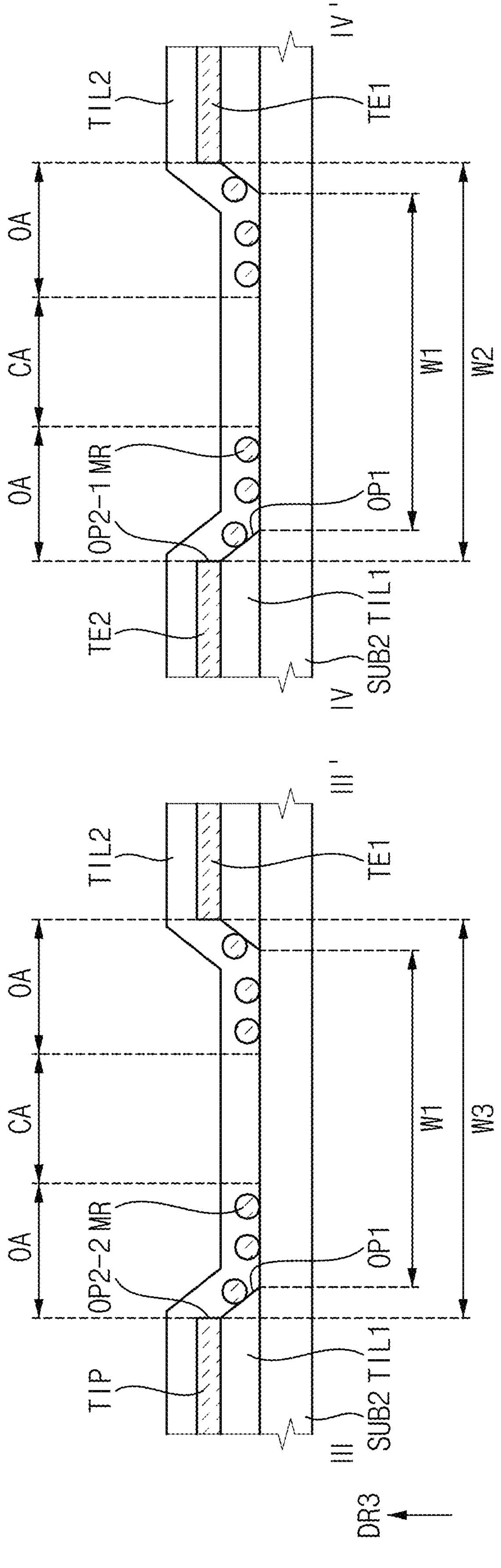
FIG. 20 is a cross-sectional view illustrating another example of a cross section taken along the line III-III' and the line IV-IV' of FIG. 7.

FIG. 20 is a cross-sectional view illustrating another example of a cross section taken along the line III-III' and the line IV-IV' of FIG. 7. Hereinafter, descriptions that overlap with those described with reference to FIG. 10 will be omitted or simplified.

Referring to FIG. 20, the first touch insulating layer TIL1 may be located on the second substrate SUB2.

According to some embodiments, in the sensing area SA, at least one first opening OP1 exposing at least a portion of the second substrate SUB2 may be defined in the first touch insulating layer TIL1. For example, the first opening OP1 may extend along the second-first opening OP2-1 and the second-second opening OP2-2. However, the first opening OP1 may not be formed in a portion of the second-first opening OP2-1 and the second-second opening OP2-2 overlapping the first and second bridge patterns BP1 and BP2 of FIGS. 7 and 9.

The first touch electrode TE1, the second touch electrode TE2, and the island electrode pattern TIP may be located on the first touch insulating layer TIL1.

As described above, the second-first opening OP2-1 may be defined between the adjacent first and second touch electrodes TE1 and TE2. In addition, the second-second opening OP2-2 may be defined between the adjacent first touch electrode TE1 and the island electrode pattern TIP and between the adjacent connection portion (e.g., the connection portion of FIG. 9) and the island electrode pattern TIP.

Each of the second-first opening OP2-1 and the second-second opening OP2-2 may overlap the first opening OP1 in the plan view. The width W2 of the second-first opening OP2-1 may be different from the width W1 of the first opening OP1, and the width W3 of the second-second opening OP2-2 may be different from the width W1 of the first opening OP1. According to some embodiments, the width W1 of the first opening OP1 may be smaller than each of the width W2 of the second-first opening OP2-1 and the width W3 of the second-second opening OP2-2.

In this case, each of the first touch electrode TE1, the second touch electrode TE2, and the island electrode pattern TIP (i.e., each of the first touch electrode array (e.g., the first touch electrode array TEA1 of FIG. 7), the second touch electrode array (e.g., the second touch electrode array TEA2 of FIG. 7), and the island electrode pattern TIP) may not overlap the first opening OP1 in the plan view. However, embodiments according to the present disclosure are not limited thereto.

Figure 21:
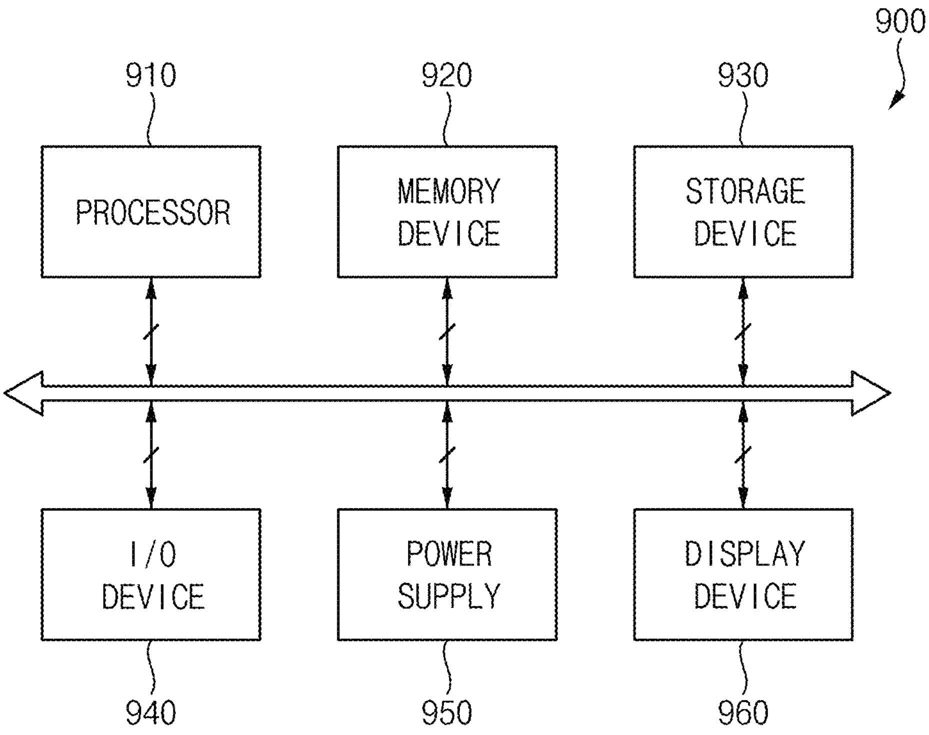
FIG. 21 is a block diagram illustrating an electronic device according to an embodiment of the present disclosure.

FIG. 21 is a block diagram illustrating an electronic device according to an embodiment of the present disclosure.

Referring to FIG. 21, in an embodiment, an electronic device 900 may include a processor 910, a memory device 920, a storage device 930, an input/output device 940, a power supply 950, and a display device 960. In this case, the display device 960 may correspond to the display device DD described with reference to FIGS. 1 to 9. The electronic device 900 may further include several ports capable of communicating with a video card, a sound card, a memory card, a USB device, and the like.

In an embodiment, the electronic device 900 may be implemented as a television. In another embodiment, the electronic device 900 may be implemented as a smart phone. However, the electronic device 900 is not limited thereto, and for example, the electronic device 900 may be implemented as a mobile phone, a video phone, a smart pad, a smart watch, a tablet PC, a vehicle navigation device, a computer monitor, a laptop computer, a head mounted display (HMD), and the like.

The processor 910 may perform certain calculations or tasks. The processor 910 may control the display device 960. In an embodiment, the processor 910 may be a microprocessor, a central processing unit (CPU), an application processor (AP), and/or the like. The processor 910 may be connected to other components through an address bus, a control bus, a data bus, and the like. The processor 910 may also be connected to an expansion bus, such as a peripheral component interconnect (PCI) bus.

The memory device 920 may store data necessary for the operation of the electronic device 900. For example, the memory device 920 may include an erasable programmable read-only memory (EPROM) device, an electrically erasable programmable read-only memory (EEPROM) device, a flash memory device, a phase change random access memory (PRAM) device, a resistance random access memory (RRAM) device, a nano floating GEe memory (NFGM) device, a polymer random access memory (PoRAM) device, a magnetic random access memory (MRAM) device, a non-volatile memory device such as a ferroelectric random access memory (FRAM) device and/or a volatile memory device such as a dynamic random access memory (DRAM) device, a static random access memory (SRAM) device, and a mobile DRAM device, and the like.

The storage device 930 may include a solid state drive (SSD), a hard disk drive (HDD), a CD-ROM, and the like.

The input/output device 940 may include input means such as a keyboard, keypad, touch pad, touch screen, mouse, and the like and output means such as a speaker, a printer, and the like.

The power supply 950 may supply power necessary for the operation of the electronic device 900. The display device 960 may be connected to other components through buses or other communication links. In an embodiment, the display device 960 may be included in the input/output device 940.

Aspects of embodiments according to the present disclosure can be applied to various display devices. For example, aspects of embodiments according to the present disclosure are applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although aspects of some embodiments have been described, those skilled in the art will readily appreciate that many modifications are possible in the embodiments without materially departing from the novel teachings and characteristics of embodiments according to the present disclosure. Accordingly, all such modifications are intended to be included within the scope of embodiments according to the present disclosure as defined in the appended claims, and their equivalents. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims, and their equivalents.

What is claimed is:

1. A touch panel comprising:

a substrate including a sensing area and a peripheral area surrounding at least a portion of the sensing area;

a first touch insulating layer on the substrate and defining at least one first opening overlapping at least a portion of the substate in a plan view in the sensing area;

a first touch electrode array including a plurality of first touch electrodes arranged in a first direction in the sensing area on the first touch insulating layer and a connection portion connecting adjacent first touch electrodes among the first touch electrodes; and a second touch electrode array including a plurality of second touch electrodes arranged in a second direction crossing the first direction in a same layer as the first touch electrodes in the sensing area, and defining a second-first opening between the first touch electrode array and the second touch electrode, the second-first opening overlapping the first opening in the plan view.

2. The touch panel of claim 1, wherein a width of the first opening is greater than a width of the second-first opening.

3. The touch panel of claim 1, wherein each of the first touch electrode array and the second touch electrode array cover a side of the first touch insulating layer exposed by the first opening.

4. The touch panel of claim 1, wherein inside the first opening, metal residual films including a same material as the first and second touch electrode arrays are located in an outer area of the second-first opening, and wherein inside the first opening, the metal residual films are not located in a central area of the second-first opening.

5. The touch panel of claim 1, further comprising:

at least one island electrode pattern in the sensing area on the first touch insulating layer and between adjacent second touch electrodes among the second touch electrodes in the plan view; and at least one bridge pattern in the sensing area between the substrate and the first touch insulating layer, entirely covered by the first touch insulating layer, and connecting the island electrode pattern and second touch electrodes adjacent to the island electrode pattern among the second touch electrodes.

6. The touch panel of claim 5, wherein a width of a portion of the second-first opening overlapping the bridge pattern in the plan view is greater than a width of a portion of the second-first opening that does not overlap the bridge pattern in the plan view.

7. The touch panel of claim 5, wherein a second-second opening is defined between the island electrode pattern and the first touch electrode array.

8. The touch panel of claim 7, wherein a width of the first opening is greater than a width of the second-second opening.

9. The touch panel of claim 7, wherein inside the first opening, metal residual films including a same material as the first and second touch electrode arrays are located in an outer area of the second-second opening, and wherein inside the first opening, the metal residual films are not located in a central area of the second-second opening.

10. The touch panel of claim 7, wherein a width of the first opening is smaller than a width of the second-first opening and the second-second opening.

11. The touch panel of claim 10, wherein each of the first and second touch electrode arrays does not overlap the first opening in the plan view.

12. The touch panel of claim 7, further comprising:

a second touch insulating layer on the first touch insulating layer, the first touch electrode array, and the second touch electrode array, and filling the first opening, the second-first opening, and the second-second opening.

13. An electronic device comprising:

a display device; and a processor which controls the display device, wherein the display device includes:

a display panel including a display area in which a plurality of pixels are arranged and a non-display area surrounding at least a portion of the display area; and a touch panel on the display panel and including:

a substrate including a sensing area corresponding to the display area, and a peripheral area surrounding at least a portion of the sensing area and corresponding to the non-display area;

a first touch insulating layer on the substrate and defining at least one first opening overlapping at least a portion of the substate in a plan view in the sensing area;

a first touch electrode array including a plurality of first touch electrodes arranged in a first direction in the sensing area on the first touch insulating layer and a connection portion connecting adjacent first touch electrodes among the first touch electrodes; and a second touch electrode array including a plurality of second touch electrodes arranged in a second direction crossing the first direction in a same layer as the first touch electrodes in the sensing area, and defining a second opening between the first touch electrode array and the second touch electrode, the second opening overlapping the first opening in a plan view.

14. The electronic device of claim 13, wherein a width of the first opening is greater than a width of the second opening.

* * * * *